United States Patent
Fujita

(10) Patent No.: US 8,283,997 B2
(45) Date of Patent: Oct. 9, 2012

(54) ELASTIC-WAVE FILTER DEVICE

(75) Inventor: Shigeyuki Fujita, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/079,882

(22) Filed: Apr. 5, 2011

(65) Prior Publication Data
US 2011/0181372 A1    Jul. 28, 2011

Related U.S. Application Data

(63) Continuation of application No. PCT/JP2009/004895, filed on Sep. 25, 2009.

(30) Foreign Application Priority Data

Nov. 4, 2008   (JP) .................................. 2008-283773

(51) Int. Cl.
*H03H 9/72*   (2006.01)
*H03H 9/64*   (2006.01)

(52) U.S. Cl. ......................... 333/133; 333/193; 333/195

(58) Field of Classification Search .................. 333/193, 333/195, 133; 310/313 B, 313 D
See application file for complete search history.

(56) References Cited

U.S. PATENT DOCUMENTS

| | | | |
|---|---|---|---|
| 6,822,537 B1 | 11/2004 | Taniguchi et al. | |
| 2004/0196119 A1 | 10/2004 | Shibahara et al. | |
| 2007/0120626 A1* | 5/2007 | Makibuchi et al. | 333/193 |
| 2009/0058555 A1* | 3/2009 | Takata et al. | 333/129 |
| 2009/0201105 A1 | 8/2009 | Ouchi | |

FOREIGN PATENT DOCUMENTS

| | | |
|---|---|---|
| EP | 2 031 755 A1 | 3/2009 |
| JP | 11-145772 A | 5/1999 |
| JP | 2004-235908 A | 8/2004 |
| JP | 2004-282707 A | 10/2004 |
| JP | 2006-180334 A | 7/2006 |
| JP | 2007-312201 * | 11/2007 |
| WO | 2004/102799 A1 | 11/2004 |
| WO | 2007/145049 A1 | 12/2007 |
| WO | 2008/078496 A1 | 7/2008 |

(Continued)

OTHER PUBLICATIONS

English language machine translation of JP 2006-180334, published Jul. 6, 2006.*

(Continued)

Primary Examiner — Barbara Summons
(74) Attorney, Agent, or Firm — Keating & Bennett, LLP

(57) ABSTRACT

An elastic-wave filter device includes a package substrate and filter mounting pattern provided on a first main surface of the package substrate on which a longitudinally coupled resonator-type elastic-wave filter is mounted, a back-side terminal pattern is provided on a second main surface thereof, and an internal electrode pattern is provided inside the package substrate. When seen in plan view from a direction perpendicular or substantially perpendicular to the first main surface of the substrate body, first via conductors electrically connecting a ground pattern element of the filter mounting pattern connected to a ground pad of the longitudinally coupled resonator-type elastic-wave filter and an internal ground pattern element of the internal electrode pattern are arranged asymmetrically with respect to a center line X-X passing through an input pattern element of the filter mounting pattern and through two output pattern elements.

10 Claims, 17 Drawing Sheets

FOREIGN PATENT DOCUMENTS

WO    WO2008146525    * 12/2008

OTHER PUBLICATIONS

English language machine translation of JP 2007-312201, published Nov. 29, 2007.*

Official Communication issued in International Patent Application No. PCT/JP2009/004895, mailed on Nov. 2, 2009.

Official Communication issued in corresponding Japanese Patent Application No. 2010-503152, mailed on Apr. 10, 2012.

* cited by examiner

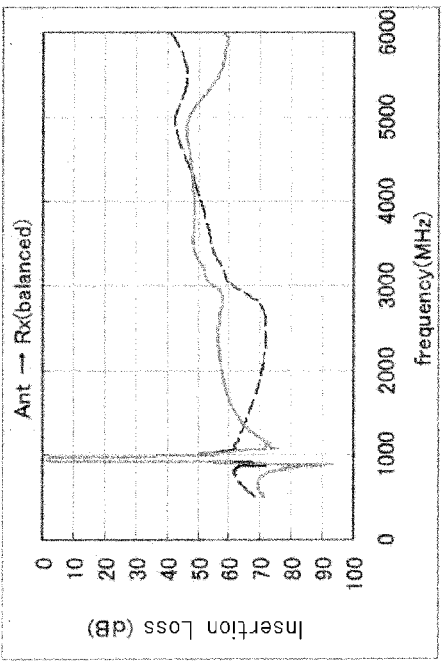
FIG. 6A BALANCED WAVEFORM OUTPUT (NEAR PASS BAND)
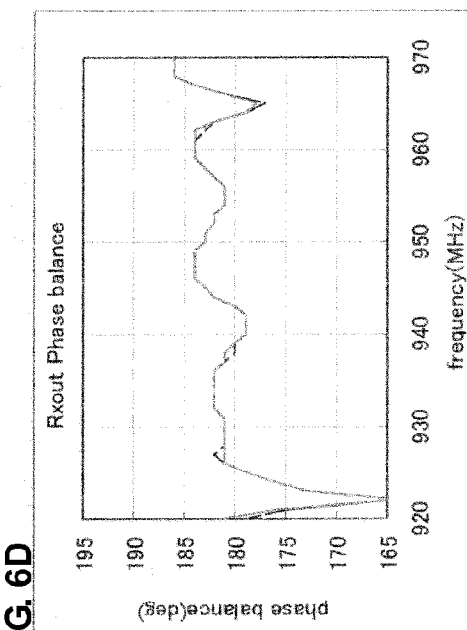
FIG. 6B BALANCED OUTPUT WAVEFORM (WIDE BAND)
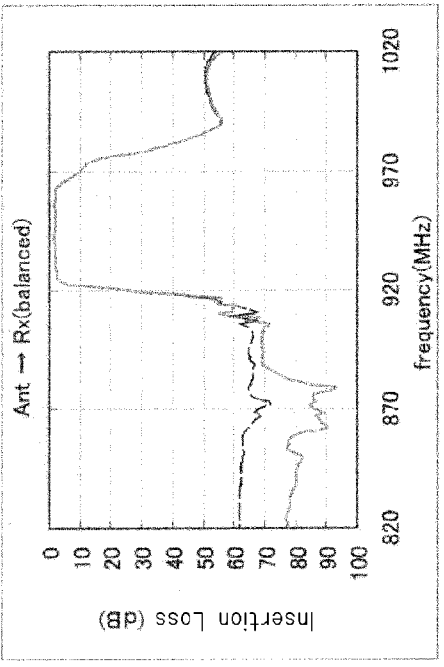
FIG. 6C BALANCED OUTPUT WAVEFORM AND BALANCE
AMPLITUDE BALANCE
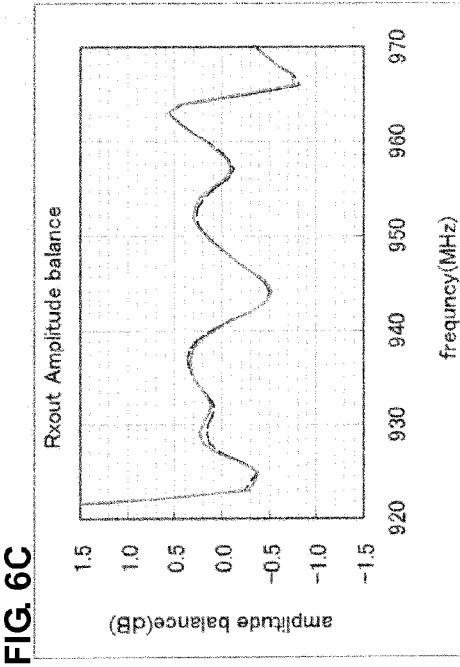
FIG. 6D BALANCED OUTPUT WAVEFORM AND BALANCE
PHASE BALANCE

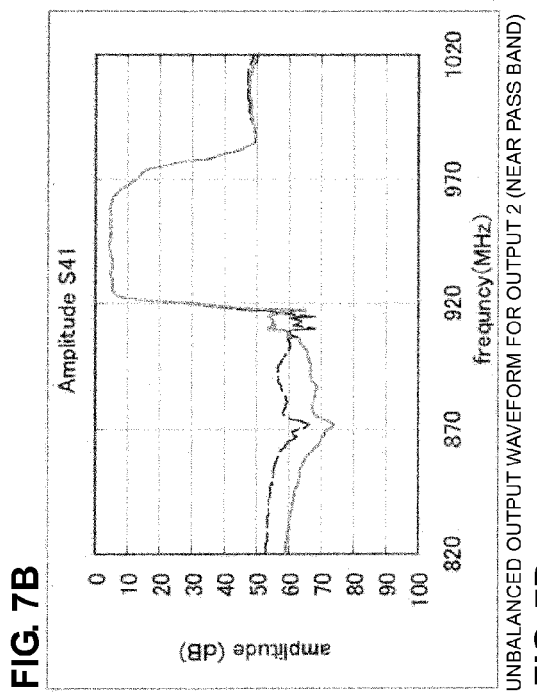
FIG. 7A UNBALANCED OUTPUT WAVEFORM FOR OUTPUT 1 (NEAR PASS BAND)
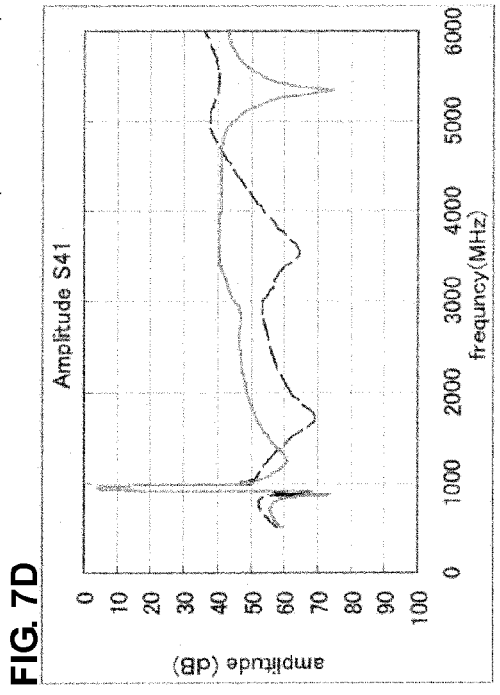
FIG. 7B UNBALANCED OUTPUT WAVEFORM FOR OUTPUT 2 (NEAR PASS BAND)
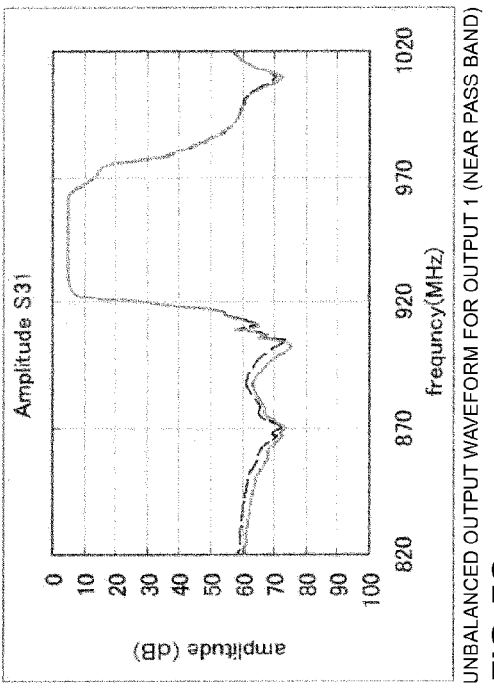
FIG. 7C UNBALANCED OUTPUT WAVEFORM FOR OUTPUT 1 (WIDE BAND)
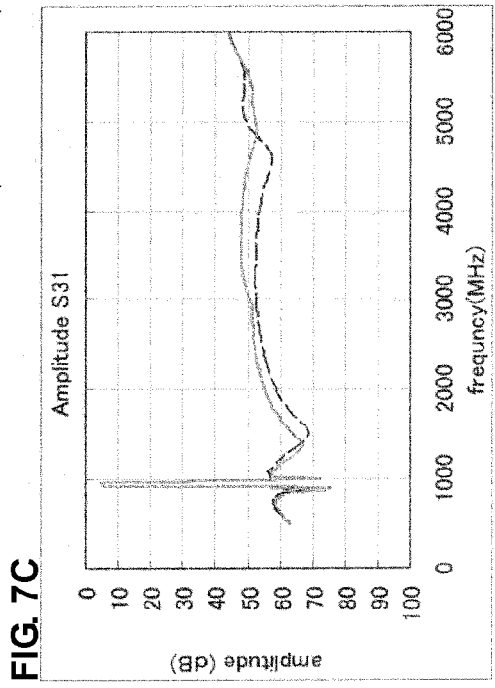
FIG. 7D UNBALANCED OUTPUT WAVEFORM FOR OUTPUT 2 (WIDE BAND)
UNBALANCED OUTPUT WAVEFORM

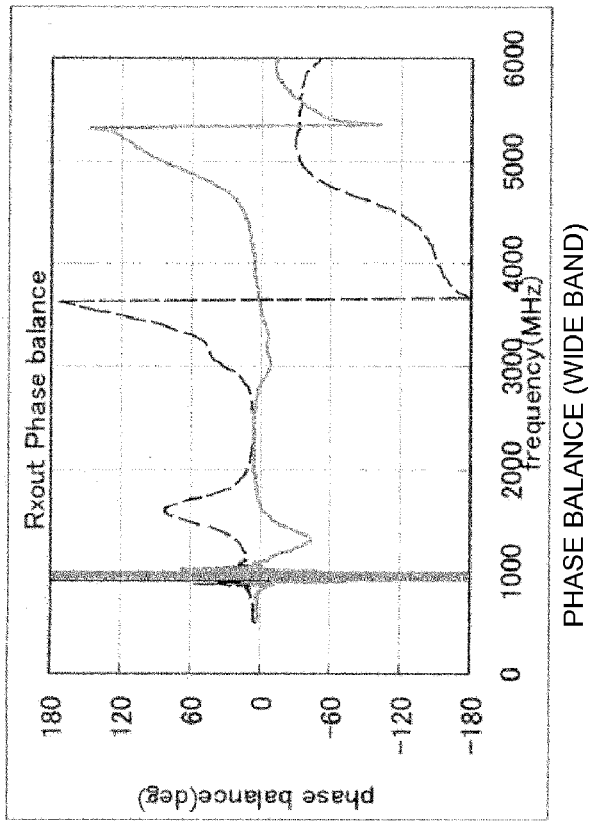
FIG. 8A AMPLITUDE BALANCE (WIDE BAND)
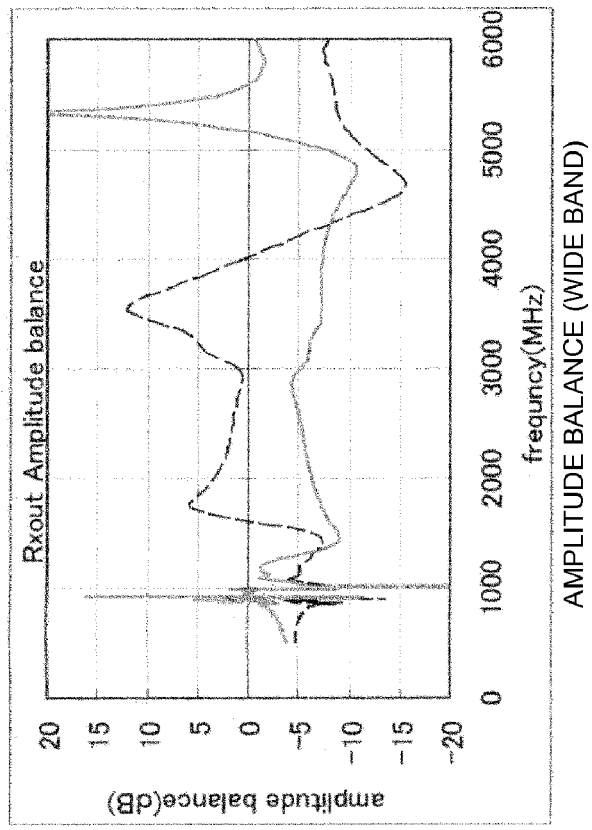
FIG. 8B PHASE BALANCE (WIDE BAND)

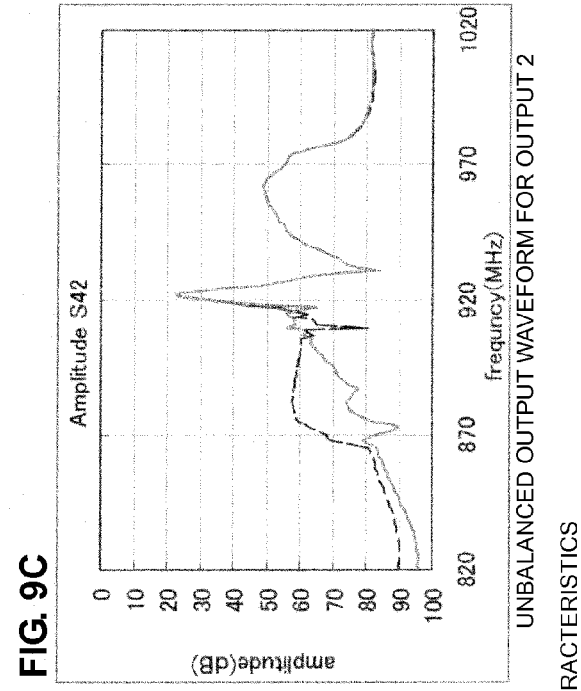
FIG. 9C UNBALANCED OUTPUT WAVEFORM FOR OUTPUT 2
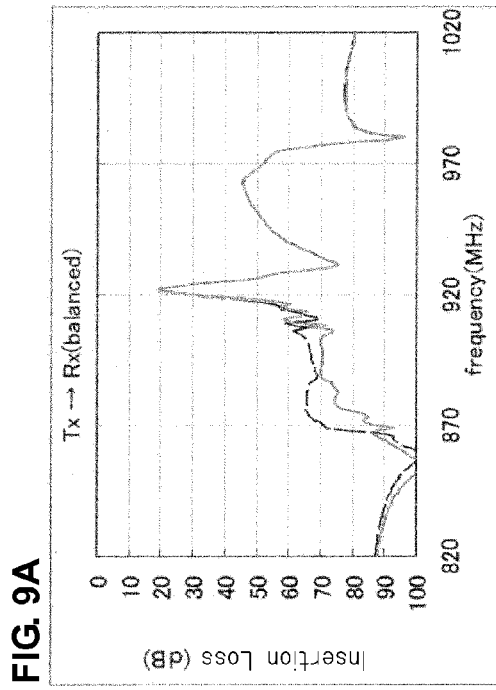
FIG. 9A BALANCED STATE WAVEFORM
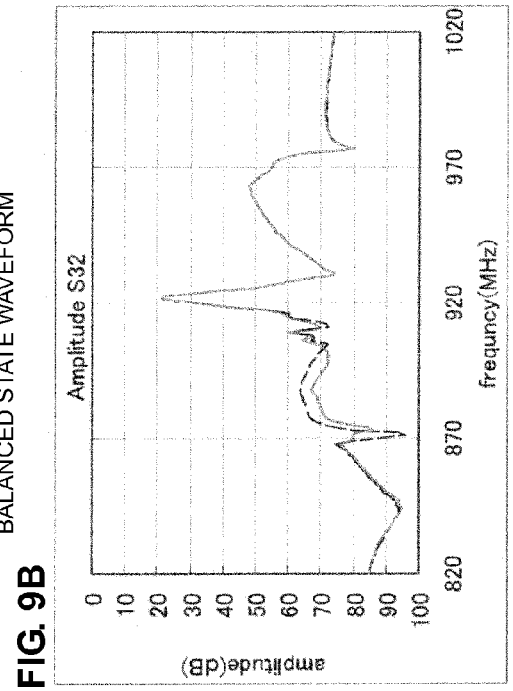
FIG. 9B UNBALANCED OUTPUT WAVEFORM FOR OUTPUT 1
ISOLATION CHARACTERISTICS

BALANCED WAVEFORM OUTPUT (NEAR PASS BAND)

BALANCED OUTPUT WAVEFORM (WIDE BAND)

AMPLITUDE BALANCE

PHASE BALANCE

BALANCED OUTPUT WAVEFORM AND BALANCE

UNBALANCED OUTPUT WAVEFORM FOR OUTPUT 1 (NEAR PASS BAND)

UNBALANCED OUTPUT WAVEFORM FOR OUTPUT 1 (WIDE BAND)

UNBALANCED OUTPUT WAVEFORM FOR OUTPUT 2 (NEAR PASS BAND)

UNBALANCED OUTPUT WAVEFORM FOR OUTPUT 2 (WIDE BAND)

UNBALANCED OUTPUT WAVEFORM

AMPLITUDE BALANCE (WIDE BAND)

PHASE BALANCE (WIDE BAND)

BALANCE (WIDE BAND)

BALANCED STATE WAVEFORM

UNBALANCED OUTPUT WAVEFORM FOR OUTPUT 1

UNBALANCED OUTPUT WAVEFORM FOR OUTPUT 2
ISOLATION CHARACTERISTICS

ELASTIC-WAVE FILTER DEVICE

BACKGROUND OF THE INVENTION

1. Field of the Invention

The present invention relates to elastic-wave filter devices, and specifically, an elastic-wave filter device that includes a longitudinally coupled resonator-type elastic-wave filter.

2. Description of the Related Art

An elastic-wave filter device in which an elastic-wave filter that utilizes an elastic wave, such as a surface acoustic wave propagating along the surface of a piezoelectric substrate or a boundary acoustic wave propagating along the boundary between a piezoelectric substrate and a solid layer, accommodated in a package, has been proposed. For such an elastic-wave filter device, the degree of out-of-band suppression may be decreased by a parasitic component of the package.

To improve out-of-band suppression, for example, Japanese Unexamined Patent Application Publication No. 11-145772 discloses, as a package on which a surface-acoustic-wave filter is mounted surface-down, a configuration illustrated in the plan view of FIG. 19.

That is, as illustrated in FIG. 19, a filter mounting pattern provided on a filter mounting surface of a package substrate 100 is electrically connected to input and output electrodes and a ground electrode of a surface-acoustic-wave filter by conductive bumps and connection patterns 141; 142a; 142b; 143a to 143d; 144a, 144b. Among the pattern elements of the filter mounting pattern, an input ground pattern element 133 and an output ground pattern element 134 are separated from one another. The pattern elements 131, 132a, 132b, 133, and 134 are electrically connected to external connection terminals 121, 122a, 122b, 123a to 123d, and 124, respectively, which are provided on side surfaces of the package substrate 100 in order to connect to an external circuit. An example of this configuration is described as having been able to improve out-of-band attenuation in a higher range than the pass band by separating the ground pattern elements.

However, with the advancement of miniaturization of products, directly connecting a plurality of ground pattern elements to a plurality of external connection terminals provided on side surfaces of the package substrate, as illustrated in FIG. 19, becomes impossible. Because of this, the pattern elements provided on the filter mounting surface of the package substrate are connected to the external connection terminals provided on the back side of the package with via conductors disposed therebetween. In this case, when the ground pattern elements are separated from one another, the area of each of the ground pattern elements is relatively small, such that the number of via conductors that can be arranged in the ground pattern elements is relatively few. This results in an increased potential difference between the potential of the ground pattern element and the reference potential surface, which leads to an increase in high-frequency current produced as a result of a parasitic component. Therefore, the degree of out-of-band suppression is reduced.

SUMMARY OF THE INVENTION

To overcome the problems described above, preferred embodiments of the present invention provide an elastic-wave filter device capable of improving out-of-band attenuation in a higher range than the pass band without deteriorating the insertion loss within the pass band even when the size of the elastic-wave filter device is reduced.

An elastic-wave filter device according to a preferred embodiment of the present invention includes a longitudinally coupled resonator-type elastic-wave filter and a package substrate on which the longitudinally coupled resonator-type elastic-wave filter is mounted. The longitudinally coupled resonator-type elastic-wave filter preferably includes an input pad, two output pads, and at least one ground pad. The package substrate preferably includes an insulation substrate body, a conductive filter mounting pattern provided on a first main surface of the substrate body, a conductive back-side terminal pattern provided on a second main surface of the substrate body, a conductive internal electrode pattern provided inside the substrate body, first via conductors that extend inside the substrate body and electrically connect the filter mounting pattern and the internal electrode pattern, and a second via conductor that extends inside the substrate body and electrically connects the internal electrode pattern and the back-side terminal pattern. The filter mounting pattern preferably includes an input pattern element connected to the input pad of the longitudinally coupled resonator-type elastic-wave filter, two output pattern elements connected to the two output pads of the longitudinally coupled resonator-type elastic-wave filter, respectively, and a ground pattern element connected to the ground pad of the longitudinally coupled resonator-type elastic-wave filter. The internal electrode pattern preferably includes an internal ground pattern element connected to the ground pattern element of the filter mounting pattern with a plurality of first via conductors disposed therebetween. The plurality of first via conductors electrically connecting the ground pattern element of the filter mounting pattern and the internal ground pattern element of the internal electrode pattern are preferably arranged asymmetrically with respect to a center line extending parallel to a side edge of the package substrate, passing through a bump disposed on the input pattern element of the filter mounting pattern, and passing between the two output pattern elements of the filter mounting pattern.

In the above configuration, the first via conductors connected to the ground pattern element of the filter mounting pattern of the package substrate are preferably arranged asymmetrically with respect to the center line. Thus, separation and concentration of a current in the ground pattern element can be adjusted to perform optimization so as to have a large amount of out-of-band attenuation.

Accordingly, out-of-band attenuation in a higher range than the pass band can be effectively improved without deteriorating the insertion loss within the pass band.

Preferably, the ground pattern element of the filter mounting pattern may have a shape that is asymmetric with respect to the center line.

In this case, separation and concentration of a current in the ground pattern element can be adjusted to perform further optimization so as to have a large amount of out-of-band attenuation.

Preferably, for the first via conductors electrically connecting the ground pattern element of the filter mounting pattern and the internal ground pattern element of the internal electrode pattern, a number of first via conductors arranged at a first side with respect to the center line may be different from a number of first via conductors arranged at a second side with respect to the center line.

In this case, separation and concentration of a current in the ground pattern element can be adjusted to perform optimization so as to have a large amount of out-of-band attenuation.

Preferably, of the first via conductors, a first via conductor connected to a first output pattern element of the two output pattern elements of the filter mounting pattern may be arranged at a first side with respect to the center line and a first via conductor connected to a second output pattern element of the two output pattern elements of the filter mounting pattern may be arranged at a second side with respect to the center line, a distance between the first via conductor connected to the first output pattern element of the filter mounting pattern arranged at the first side and the center line may be greater than a distance between the first via conductor connected to the second output pattern element of the filter mounting pattern arranged at the second side and the center line, and for the first via conductors electrically connecting the ground pattern element of the filter mounting pattern and the internal ground pattern element of the internal electrode pattern, the number of first via conductors arranged at the first side with respect to the center line may be greater than the number of first via conductors arranged at the second side with respect to the center line.

In this case, among the first via conductors connecting the ground pattern element and the internal ground pattern element, of the first via conductors connected to the two output pattern elements, the number of first via conductors arranged at a first side with respect to the center line with a greater distance from the center line is greater than that at a second side with respect to the center line. This enables separation and concentration of a current that flows between the ground pattern element and the internal ground pattern element to be adjusted to perform optimization so as to have a large amount of out-of-band attenuation.

The longitudinally coupled resonator-type elastic-wave filter may preferably include first and second elastic-wave filter elements. Each of the first and second elastic-wave filter elements may preferably include an input terminal connected to the input pad directly or with another element disposed therebetween. The first and second elastic-wave filter elements may preferably have output terminals connected to the different output pads, respectively, directly or with another element disposed therebetween.

In this case, even with a small size, the out-of-band attenuation in a higher range than the pass band can be improved without deteriorating the degree of balance within the pass band.

Preferably, the first elastic-wave filter element may include first and second cascaded longitudinally coupled resonator-type elastic-wave filter units. The second elastic-wave filter element may include third and fourth cascaded longitudinally coupled resonator-type elastic-wave filter units. Each of the first to fourth longitudinally coupled resonator-type elastic-wave filter units may preferably include three IDTs arranged along a propagation direction of an elastic wave. A first end of a centrally located IDT of the three IDTs of the first longitudinally coupled resonator-type elastic-wave filter unit and a first end of a centrally located IDT of the three IDTs of the third longitudinally coupled resonator-type elastic-wave filter unit may be connected to the input pad directly or with another element disposed therebetween. A first end of a centrally located IDT of the three IDTs of the second longitudinally coupled resonator-type elastic-wave filter unit may be connected to a first output pad of the two output pads directly or with another element disposed therebetween. A first end of a centrally located IDT of the three IDTs of the fourth longitudinally coupled resonator-type elastic-wave filter unit may be connected to a second output pad of the two output pads directly or with another element disposed therebetween. First ends of IDTs arranged at both sides of the three IDTs of the first longitudinally coupled resonator-type elastic-wave filter unit may be connected to first ends of IDTs arranged at both sides of the three IDTs of the second longitudinally coupled resonator-type elastic-wave filter unit, respectively. First ends of IDTs arranged at both sides of the three IDTs of the third longitudinally coupled resonator-type elastic-wave filter unit may be connected to first ends of IDTs arranged at both sides of the three IDTs of the fourth longitudinally coupled resonator-type elastic-wave filter unit, respectively. One of the first to fourth longitudinally coupled resonator-type elastic-wave filters preferably has a phase that differs by 180 degrees from a phase of the other three.

In this case, the longitudinally coupled resonator-type elastic-wave filter is a balanced filter that receives an unbalanced signal and outputs a balanced signal.

Preferably, the substrate body of the package substrate may include the pair of main surfaces and four side surfaces extending between the main surfaces, the main surfaces preferably being rectangular or substantially rectangular, spaced away from each other, and extending in parallel or substantially in parallel to each other. The back-side terminal pattern provided on the second main surface of the substrate body may include two output terminals arranged along a side surface of the four side surfaces. When the substrate body is seen in plan view from a direction perpendicular or substantially perpendicular to the first main surface thereof, only a first output terminal of the two output terminals may be arranged on the center line and, for the first via conductors connecting the ground pattern element of the filter mounting pattern and the ground pattern element of the internal electrode pattern, a number of first via conductors arranged at a first side where a second output terminal of the two output terminals is arranged with respect to the center line may preferably be greater than a number of first via conductors arranged at a second side with respect to the center line.

A duplexer according to a preferred embodiment of the present invention includes the elastic-wave filter device according to a preferred embodiment of the present invention and a transmission filter mounted on the package substrate of the elastic-wave filter device and including a ladder circuit. The longitudinally coupled resonator-type elastic-wave filter of the elastic-wave filter preferably is a reception band pass filter. The substrate body of the package substrate of the elastic-wave filter device preferably includes the pair of main surfaces and four side surfaces extending between the main surfaces, the main surfaces being rectangular or substantially rectangular and spaced away from each other and extending in parallel or substantially parallel to each other. The back-side terminal pattern provided on the second main surface of the substrate body includes two output terminals arranged along a side surface of the four side surfaces and an antenna terminal arranged along another side surface being adjacent to the side surface. The antenna terminal is connected to the input pad of the longitudinally coupled resonator-type elastic-wave filter and to an end of the transmission filter.

With this configuration, for the reception band pass filter of the duplexer, out-of-band attenuation in a higher range than the pass band is improved without deteriorating the insertion loss and the degree of balance within the pass band.

With various preferred embodiments of the present invention, even with a small size, the out-of-band attenuation in a higher range than the pass band is effectively improved without deteriorating the insertion loss within the pass band.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 6A to 6D are graphs illustrating balanced output waveforms and balance according to the first preferred embodiment of the present invention and according to the first comparative example.

FIGS. 7A to 7D are graphs illustrating unbalanced output waveforms according to the first preferred embodiment of the present invention and according to the first comparative example.

FIGS. 8A and 8B are graphs illustrating balance (in wide-band) according to the first preferred embodiment of the present invention and according to the first comparative example.

FIGS. 9A to 9C are graphs illustrating isolation characteristics according to the first preferred embodiment of the present invention and according to the first comparative example.

DETAILED DESCRIPTION OF THE PREFERRED EMBODIMENTS

Preferred embodiments of the present invention are described below with reference to FIGS. 1 to 18.

First Preferred Embodiment

An elastic-wave filter device 10 according to a first preferred embodiment of the present invention is described with reference to FIGS. 1 to 9.

Figure 1:
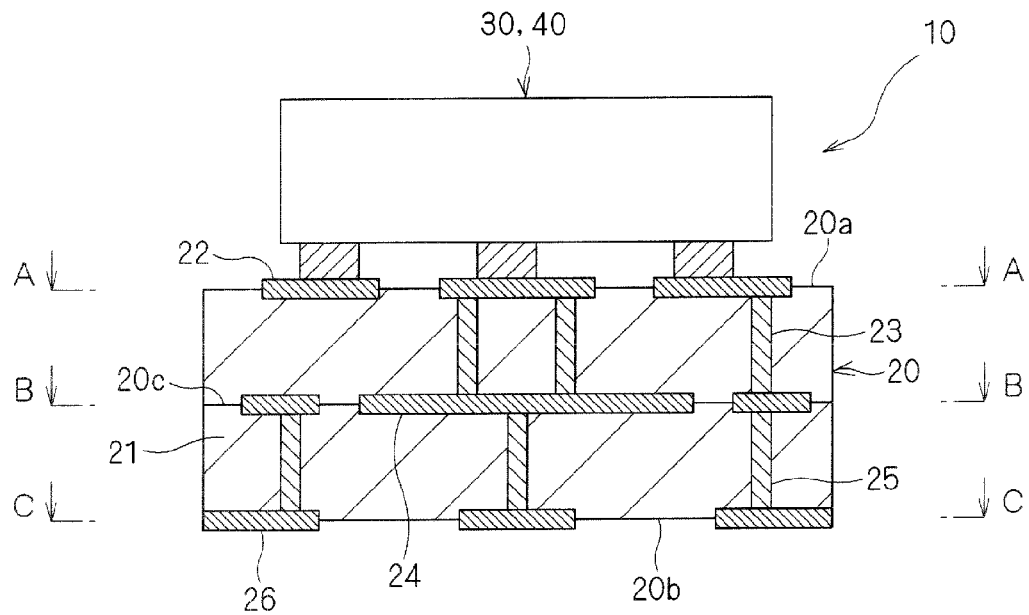
FIG. 1 is a cross-sectional view of an elastic-wave filter device according to a first preferred embodiment of the present invention.
Figure 2:
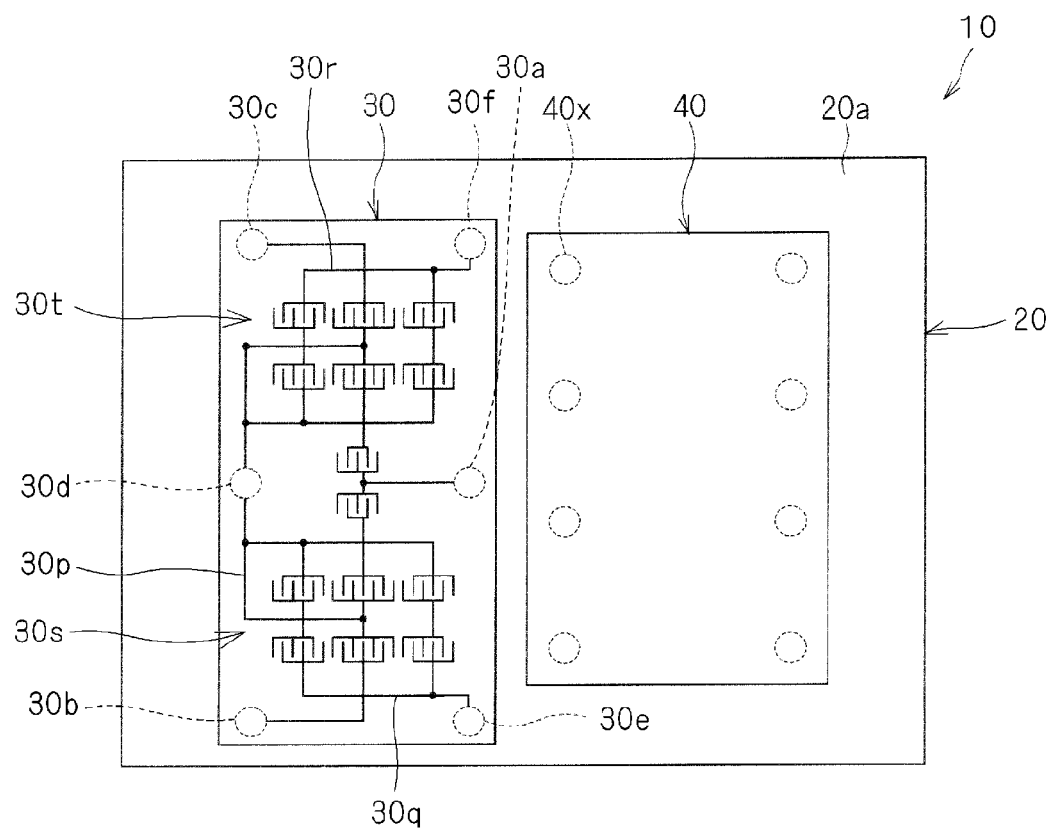
FIG. 2 is a plan view of the elastic-wave filter device according to the first preferred embodiment of the present invention.

FIG. 1 is a cross-sectional view of the elastic-wave filter device 10. FIG. 2 is a plan view of the elastic-wave filter device 10 and schematically illustrates an internal configuration of a reception filter 30.

As illustrated in FIGS. 1 and 2, the elastic-wave filter device 10 is preferably a duplexer in which the reception filter 30 and a transmission filter 40 are mounted on a package substrate 20. For example, the reception filter 30 may preferably be a longitudinally coupled resonator-type surface-acoustic-wave (SAW) filter, and the transmission filter 40 may preferably be a surface-acoustic-wave (SAW) filter having a ladder circuit.

The package substrate 20 is preferably a composite substrate that includes a plurality of insulation layers and a conductive pattern provided therebetween. Specifically, in the package substrate 20, a conductive filter mounting pattern 22 used to mount the reception filter 30 and the transmission filter 40 is provided on a filter mounting surface 20a defining a first main surface of an insulation substrate body 21. As illustrated in FIG. 1, a conductive back-side terminal pattern 26 is provided on a back-side terminal surface 20b defining a second main surface of the substrate body 21. Back-side terminals used to connect the elastic-wave filter device 10 to an external circuit are preferably provided in the back-side terminal pattern 26. A conductive internal electrode pattern 24 is provided on an internal electrode surface 20c inside the substrate body 21, that is, on an interface of insulating layers. The filter mounting pattern 22 and the internal electrode pattern 24 are electrically connected to each other with first via conductors 23 provided inside the substrate body 21. The internal electrode pattern 24 and the back-side terminal pattern 26 are electrically connected to second via conductors 25 provided inside the substrate body 21.

The substrate body 21 preferably has a rectangular or substantially rectangular flat shape, for example. That is, preferably, the filter mounting surface 20a and the back-side terminal surface 20b of the substrate body 21 are rectangular or substantially rectangular, for example, and spaced away from each other and extend in parallel or substantially in parallel to each other. The substrate body 21 includes four side surfaces between the filter mounting surface 20a and the back-side terminal surface 20b.

As schematically illustrated in FIG. 2, the reception filter 30 is preferably a longitudinally coupled resonator-type filter that includes a first elastic-wave filter element 30s, a second elastic-wave filter element 30t, an input pad 30a arranged to receive an unbalanced signal, two output pads 30b and 30c arranged to output a balanced signal, an input ground pad 30d, and output ground pads 30e and 30f, for example. The pads 30a to 30f are provided on the back side of the reception filter 30 and electrically connected to the filter mounting pattern 22 of the package substrate 20.

Figure 3:
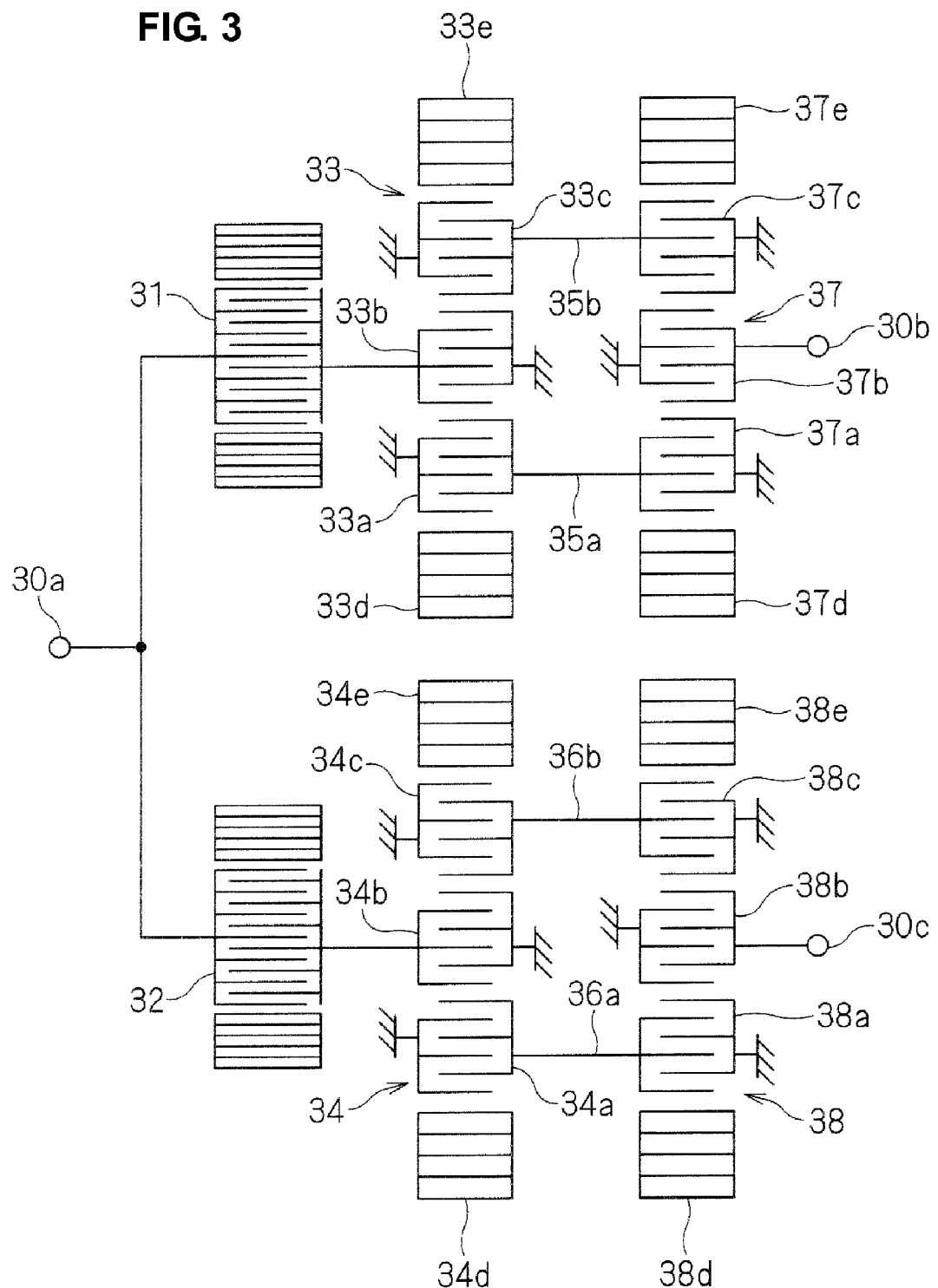
FIG. 3 illustrates a schematic configuration of an elastic-wave filter element according to the first preferred embodiment of the present invention.

FIG. 3 illustrates a schematic configuration of the reception filter 30. As illustrated in FIG. 3, the reception filter 30 preferably includes two groups of cascaded longitudinally coupled resonator-type elastic-wave filter elements 33, 37; and 34, 38. First ends of first longitudinally coupled resonator-type elastic-wave filter elements 33 and 34 of the groups are connected to the input pad 30*a* with different resonators 31 and 32 disposed therebetween, respectively. First ends of second longitudinally coupled resonator-type elastic-wave filter elements 37 and 38 are connected to the different output pads 30*b* and 30*c*, respectively.

Specifically, the longitudinally coupled resonator-type elastic-wave filter elements 33, 34, 37, and preferably include first to third interdigital transducers (IDTs) 33*a*, 33*b*, 33*c*; 34*a*, 34*b*, 34*c*; 37*a*, 37*b*, 37*c*; and 38*a*, 38*b*, 38*c* provided along a propagation direction of an elastic wave, respectively, and pairs of reflectors 33*d*, 33*e*; 34*d*, 34*e*; 37*d*, 37*e*; and 38*d*, 38*e* arranged at both sides of regions in which the first to third IDTs 33*a*, 33*b*, 33*c*; 34*a*, 34*b*, 34*c*; 37*a*, 37*b*, 37*c*; and 38*a*, 38*b*, 38*c* are arranged in the propagation direction of the elastic wave, respectively.

Of the three IDTs 33*a*, 33*b*, 33*c*; three IDTs 34*a*, 34*b*, 34*c* of the first longitudinally coupled resonator-type elastic-wave filter elements 33 and 34 of the groups, the centrally positioned second IDTs 33*b* and 34*b* preferably include first ends connected to the resonators 31 and 32, respectively, and second ends being grounded. Of the three IDTs 37*a*, 37*b*, 37*c*; three IDTs 38*a*, 38*b*, 38*c* of the second longitudinally coupled resonator-type elastic-wave filter elements 37 and 38 of the groups, the centrally positioned second IDTs 37*b* and 38*b* preferably include first ends connected to the output pads 30*b* and 30*c*, respectively, and second ends being grounded.

Preferably, first ends of first and third IDTs 33*a*, 33*c*; IDTs 34*a*, 34*c* arranged at both sides of the three IDTs 33*a*, 33*b*, 33*c*; three IDTs 34*a*, 34*b*, 34*c* of the first longitudinally coupled resonator-type elastic-wave filter elements 33 and 34 of the groups and first ends of first and third IDTs 37*a*, 37*c*; 38*a*, 38*c* arranged at both sides of the three IDTs 37*a*, 37*b*, 37*c*; three IDTs 38*a*, 38*b*, 38*c* of the second longitudinally coupled resonator-type elastic-wave filter elements 37 and 38 of the groups are connected to each other with wiring 35*a*, 35*b*; 36*a*, 36*b*, respectively, and second ends thereof are grounded.

The second IDT 37*b* of the longitudinally coupled resonator-type elastic-wave filter element 37 of the four longitudinally coupled resonator-type elastic-wave filter elements 33, 34, 37, and 38 is preferably inverted with respect to the second IDTs 33*b*, 34*b*, and 38*b* of the other three longitudinally coupled resonator-type elastic-wave filter elements 33, 34, and 38. The phase of a signal extracted from the first output pad 30*b* differs by 180 degrees from the phase of a signal extracted from the second output pad 30*c*.

The configuration of the reception filter 30 is not limited to the one illustrated in FIG. 3, and various configurations can be made. For example, a configuration may be used in which the resonators 31 and 32 are removed from the configuration of FIG. 3, the first end of each of the second IDTs 33*b* and 34*b* of the first longitudinally coupled resonator-type elastic-wave filter elements 33 and 34 of the groups is connected to the input pad 30*a*, and the second end thereof is grounded. Alternatively, a configuration may be used in which the resonators 31 and 32 and the first longitudinally coupled resonator-type elastic-wave filter elements 33 and 34 of the groups may be removed from the configuration of FIG. 3, the first end of each of the second IDTs 37*b* and 38*b* of the second longitudinally coupled resonator-type elastic-wave filter elements of the groups is connected to the input pad 30*a*, the first end of each of the first and third IDTs 37*a* and 37*c* of the longitudinally coupled resonator-type elastic-wave filter element 37 is connected to the first output pad 30*b*, the first end of each of the first and third IDTs 38*a* and 38*c* of the longitudinally coupled resonator-type elastic-wave filter element 38 is connected to the second output pad 30*c*, and the second end thereof is grounded.

As illustrated in FIG. 2, the transmission filter 40 preferably includes eight pads 40*x*, for example.

Figure 4A:
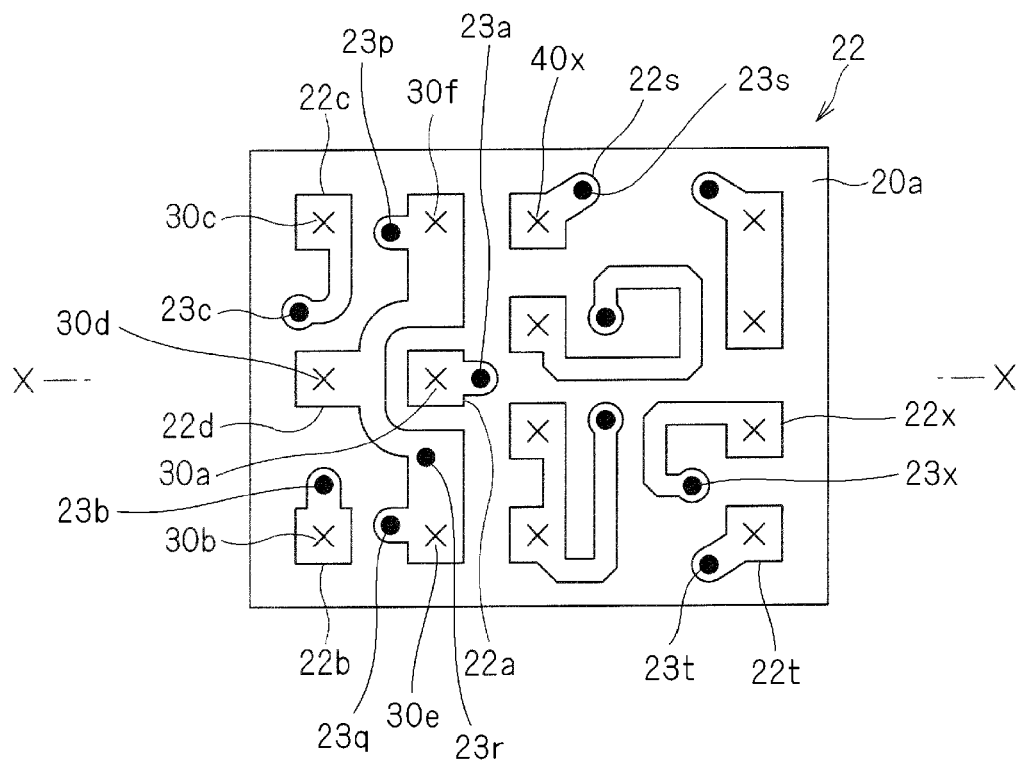
FIG. 4A is a plan view of a filter mounting surface of a package substrate according to the first preferred embodiment of the present invention.

FIG. 4A is a plan view as seen along the line A-A of FIG. 1, that is, a plan view of the filter mounting surface 20*a* of the package substrate 20. In FIG. 4A, the cross symbols schematically indicate the locations of the pads of each of the reception filter 30 and the transmission filter 40. The solid circle symbols schematically indicate the locations of first via conductors 23*a*, 23*b*, 23*c*, 23*p*, 23*q*, 23*r*, 23*s*, 23*t*, and 23*x* provided between the filter mounting surface 20*a* and the internal electrode surface 20*c*.

As illustrated in FIG. 4A, which is seen from the vertical direction of the filter mounting surface 20*a*, the filter mounting pattern 22 provided on the filter mounting surface 20*a* preferably includes an input pattern element 22*a* connected to the input pad 30*a* of the reception filter 30, output pattern elements 22*b* and 22*c* connected to the two output pads 30*b* and 30*c* of the reception filter 30, respectively, and a ground pattern element 22*d* connected to the ground pads 30*d*, 30*e*, and 30*f* of the reception filter 30. The filter mounting pattern 22 preferably further includes a transmission output pattern element 22*s*, a transmission input pattern element 22*t*, and four transmission ground pattern elements 22*x*, the pattern elements 22*s*, 22*t*, and 22*x* being connected to the respective pads 40*x* of the transmission filter 40.

The ground pattern element 22*d* preferably has a shape that is symmetric with respect to the center line X-X passing through the input pattern element 22*a* and passing between the output pattern elements 22*b* and 22*c*. However, the first via conductors 23*p*, 23*q*, and 23*r* connected to the ground pattern element 22*d* are preferably arranged asymmetrically with respect to the center line X-X.

For the first via conductors 23*p*, 23*q*, and 23*r* connected to the ground pattern element 22*d*, different numbers of first via conductors are preferably arranged at both sides with respect to the center line X-X.

The first via conductor 23*b* connected to the first output pattern element 22*b* is preferably arranged at a first side (lower side in FIG. 4A) with respect to the center line X-X, whereas the first via conductor 23*c* connected to the second output pattern element 22*c* is arranged at a second side (upper side in FIG. 4A) with respect to the center line X-X. The distance between the first via conductor 23*b* connected to the first output pattern element 22*b* and the center line X-X is greater than the distance between the first via conductor 23*c* connected to the second output pattern element 22*c* and the center line X-X. Of the three first via conductors 23*p*, 23*q*, and 23*r* connected to the ground pattern element 22*d*, the two first via conductors 23*q* and 23*r* are preferably arranged at a first side with respect to the center line X-X, and the single first via conductor 23*p* is preferably arranged at a second side with respect to the center line X-X. That is, for the three first via conductors 23*p*, 23*q*, and 23*r* connected to the ground pattern element 22*d*, the number of first via conductors arranged at a first side with respect to the center line X-X, that is, a side where the first via conductor 23*b* is arranged with a greater distance to the center line X-X is greater than the number of first via conductors arranged at a second side with respect to the center line X-X, that is, a side at which the first via conductor 23*c* is arranged with a shorter distance to the center line X-X.

Figure 5A:
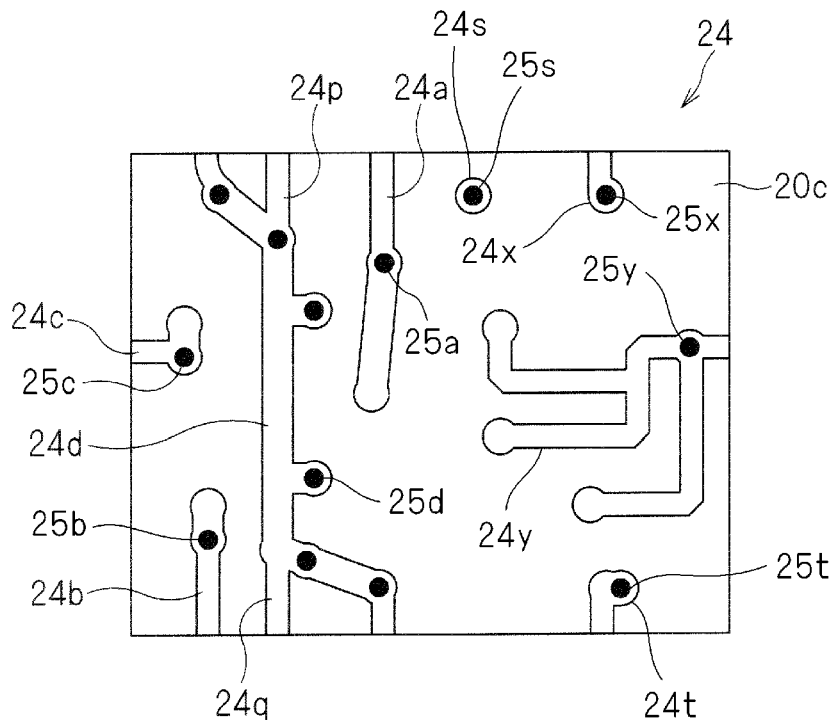
FIG. 5A a plan view of a second electrode surface and FIG. 5B is an illustration seen in plan view of a back-side terminal surface according to the first preferred embodiment of the present invention.

FIG. 5A is a plan view as seen along the line B-B of FIG. 1, that is, a plan view of the internal electrode surface 20*c* of the substrate body 21. In FIG. 5A, the solid circle symbols schematically indicate the locations of second via conductors 25a to 25d, 25s, 25t, 25x, and 25y provided between the internal electrode surface 20c and the back-side terminal surface 20b. As illustrated in FIG. 5A, the internal electrode pattern 24 is provided on the internal electrode surface 20c. The internal electrode pattern 24 preferably includes an internal input pattern element 24a connected to the input pattern element 22a of the filter mounting pattern 22 illustrated in FIG. 4A with the first via conductor 23a disposed therebetween, a first internal output pattern element 24b connected to the first output pattern element 22b of the filter mounting pattern 22 illustrated in FIG. 4A with the first via conductor 23b disposed therebetween, a second internal output pattern element 24c connected to the second output pattern element 22c of the filter mounting pattern 22 illustrated in FIG. 4a with the first via conductor 23c disposed therebetween, an internal ground pattern element 24d connected to the ground pattern element 22d of the filter mounting pattern 22 illustrated in FIG. 4A with the first via conductors 23p, 23q, and 23r disposed therebetween, a transmission internal output pattern element 24s connected to the transmission output pattern element 22s of the filter mounting pattern 22 illustrated in FIG. 4A with the first via conductor 23s disposed therebetween, a transmission internal input pattern element 24t connected to the transmission input pattern element 22t of the filter mounting pattern 22 illustrated in FIG. 4A with the first via conductor 23t disposed therebetween, and two transmission internal ground pattern elements 24x and 24y connected to the four transmission ground pattern elements 22x of the filter mounting pattern 22 illustrated in FIG. 4a with the four first via conductors 23x disposed therebetween.

Figure 5B:
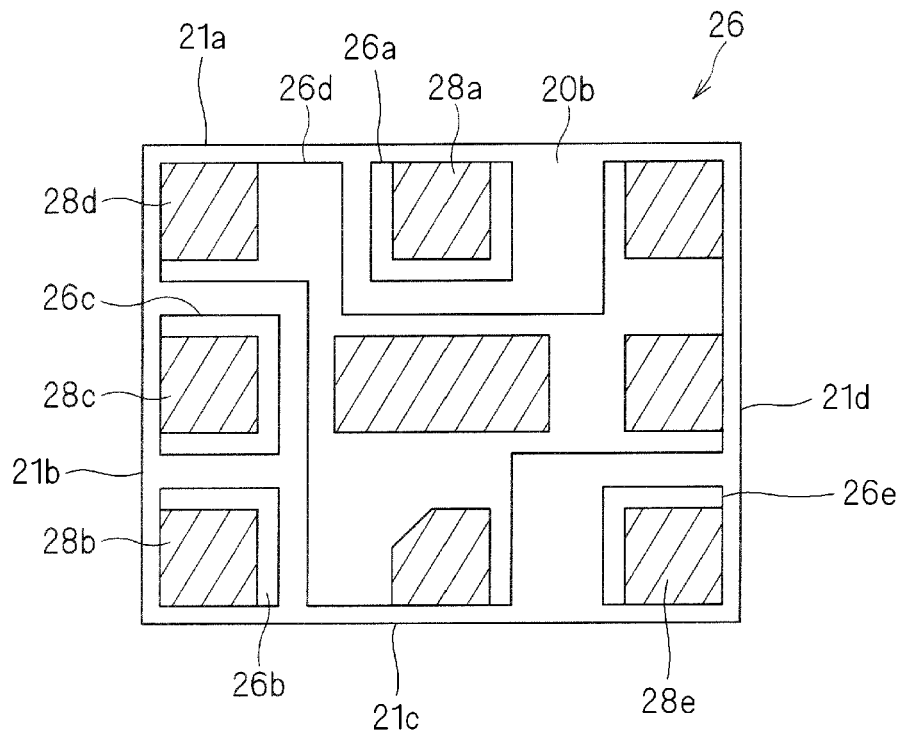

FIG. 5B is an illustration seen in plan view along the line C-C of FIG. 1, that is, an illustration seen in plan view of the back-side terminal surface 20b of the package substrate 20. As illustrated in FIG. 5B, preferably the back-side terminal pattern 26 including a first pattern element 26a for unbalanced signals, two second and third pattern elements 26b and 26c for balanced signals, a fourth pattern element 26d for grounding, and a fifth pattern element 26e is provided on the back-side terminal surface 20b. The first pattern element 26a is connected to the internal input pattern element 24a of the internal electrode pattern 24 illustrated in FIG. 5A with the second via conductor 25a disposed therebetween and connected to the transmission output pattern element 24s of the internal electrode pattern 24 with the second via conductor 25s disposed therebetween. The second pattern element 26b is connected to the first internal output pattern element 24b of the internal electrode pattern 24 illustrated in FIG. 5A with the second via conductor 25b disposed therebetween. The third pattern element 26c is connected to the second internal output pattern element 24c of the internal electrode pattern 24 illustrated in FIG. 5A with the second via conductor 25c disposed therebetween. The fourth pattern element 26d is connected to the internal ground pattern element 24d of the internal electrode pattern 24 illustrated in FIG. 5A with the six second via conductors 25d disposed therebetween and connected to the two transmission internal ground pattern elements 24x and 24y of the internal electrode pattern 24 illustrated in FIG. 5A with the two second via conductors 25x and 25y. The fifth pattern element 26e is connected to the transmission internal input pattern element 24t of the internal electrode pattern 24 illustrated in FIG. 5A with the second via conductor 25t disposed therebetween.

Preferably, an antenna terminal 28a is connected to an antenna and is one from which a transmission signal is output to the antenna and to which a reception signal is input from the antenna. The antenna terminal 28a is electrically connected to the input pad 30a of the reception filter 30 with the first pattern element 26a of the back-side terminal pattern 26, the second via conductor 25a, the internal input pattern element 24a of the internal electrode pattern 24, the first via conductor 23a, and the input pattern element 22a of the filter mounting pattern 22 disposed therebetween. The antenna terminal 28a is also electrically connected to one of the pads 40x of the transmission filter 40 with the first pattern element 26a of the back-side terminal pattern 26, the second via conductor 25s, the transmission internal output pattern element 24s of the internal electrode pattern 24, the first via conductor 23s, and the transmission output pattern element 22s of the filter mounting pattern 22 disposed therebetween.

Output terminals 28b and 28c are preferably arranged to output a balanced signal and to be connected to a reception circuit. The output terminals 28b and 28c are electrically connected to the output pads 30b and 30c of the reception filter 30, respectively, with the second and third pattern elements 26b and 26c of the back-side terminal pattern 26, the second via conductors 25b and 25c, the internal output pattern elements 24b and 24c of the internal electrode pattern 24, the first via conductors 23b and 23c, and the output pattern elements 22b and 22c of the filter mounting pattern 22 disposed therebetween, respectively.

An input terminal 28e is preferably connected to a transmission circuit and is a terminal to which a transmission signal is input. The input terminal 28e is electrically connected to one of the pads 40x of the transmission filter 40 with the fifth pattern element 26e of the back-side terminal pattern 26, the second via conductor 25t, the transmission internal input pattern element 24t of the internal electrode pattern 24, the first via conductor 23t, and the transmission input pattern element 22t of the filter mounting pattern 22 disposed therebetween.

As illustrated in FIG. 5B, preferably, the output terminals 28b and 28c are arranged along a side surface 21b of the four side surfaces of the substrate body 21, and the antenna terminal 28a is arranged along a side surface 21a adjacent to the side surface 21b. The first output terminal 28c is disposed on the center line X-X, whereas the second output terminal 28b is disposed at a first side with respect to the center line X-X, that is, a side at which a greater number of first via conductors are arranged of the first via conductors 23p, 23q, and 23r connected to the ground pattern element 22d, as previously described.

Next, a first comparative example is described with reference to FIG. 4B. The first comparative example has substantially the same configuration as in the first preferred embodiment. Accordingly, the same reference numerals are used as in the first preferred embodiment for the same components, and the description is primarily directed to the differences from the first preferred embodiment.

Figure 4B:
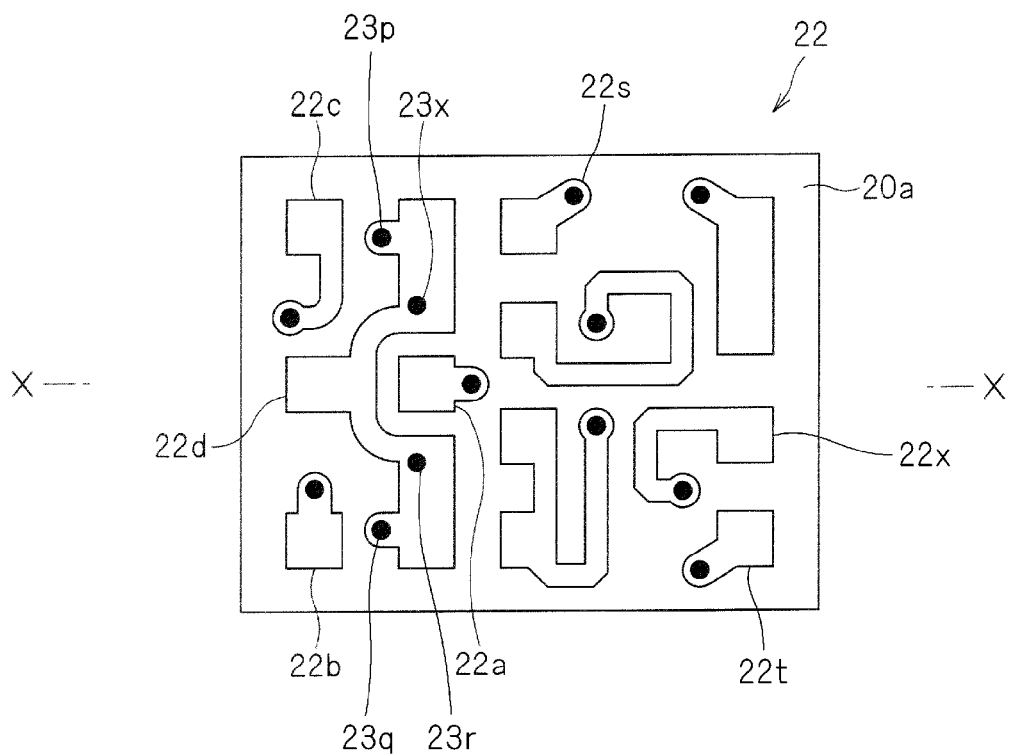
FIG. 4B is a plan view of a filter mounting surface of a package substrate according to a first comparative example.

FIG. 4B is a plan view of the filter mounting surface 20a of the package substrate, similar to FIG. 4A for the first preferred embodiment. As illustrated in FIG. 4B, the filter mounting pattern 22 having the same or substantially the same shape as in the first preferred embodiment is provided on the filter mounting surface 20a.

For the first preferred embodiment illustrated in FIG. 4A, the three first via conductors 23p, 23q, and 23r are connected to the ground pattern element 22d, and these first via conductors 23p, 23q, and 23r are arranged asymmetrically with respect to the center line X-X. In contrast, for the first comparative example, in addition to the first via conductors 23p, 23q, and 23r, one more first via conductor 23x is connected to the ground pattern element 22d. The first via conductors 23p, 23*q*, 23*r*, and 23*x* connected to the ground pattern element 22*d* are arranged symmetrically with respect to the center line X-X.

Next, results of characteristics measured for examples of the first preferred embodiment and first comparative example are shown in FIGS. 6A to 9C. The elastic-wave filter device of the examples is a duplexer designed for use in UMTS Band 8 and having the balanced-to-unbalanced transforming function. As the reception filter 30, a filter having a pass band of about 925 MHz to about 960 MHz and supporting a band of about 880 MHz to about 915 MHz of its counterpart filter was used. In FIGS. 6A to 9C, the solid lines indicate results of measurement for the example of the first preferred embodiment, and the broken lines indicate results of measurement for the example of the first comparative example.

FIGS. 6A to 6D illustrate balanced output waveforms and balance. The phase balance illustrated in FIG. 6D is |∠S31-∠S41|. FIGS. 6A to 6D reveal that the degree of suppression in the vicinity of the pass band in the first preferred embodiment is improved without a deterioration in the insertion loss, amplitude balance, and phase balance as compared to the first comparative example.

FIGS. 7A to 7D illustrate unbalanced output waveforms. FIGS. 7A to 7D reveal that the degree of suppression in the vicinity of the pass band in an unbalanced state for the output 2 in the first preferred embodiment is greatly improved as compared to the first comparative example.

FIGS. 8A and 8B illustrate balance (in wide-band). The phase balance illustrated in FIG. 8B is |∠S31|-|∠S41|. FIGS. 8A and 8B reveal that, in particular, the amplitude balance in the vicinity of the pass band is close to 0 dB and is improved as compared to the first comparative example and also that the phase balance in almost all frequency bands is close to 0 degree and is improved as compared to the first comparative example.

FIGS. 9A to 9C illustrate isolation characteristics. FIGS. 9A to 9C reveal that the isolation in the transmission band in the first preferred embodiment is improved as compared to the first comparative example.

Typically, when the input ground and the output ground are electrically shared, the degree of out-of-band suppression is deteriorated, as in the first comparative example. This is because separation and concentration of a high-frequency current produced as a result of a parasitic component cannot be achieved.

Figure 20:
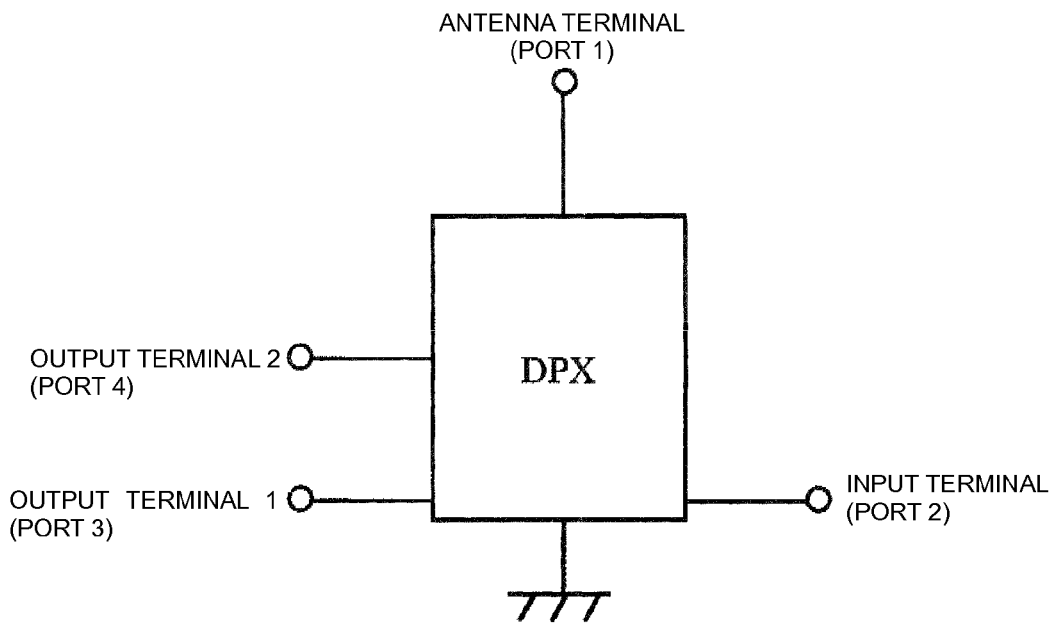
FIG. 20 illustrates a schematic configuration of a duplexer.

In the expression for phase balance, a number added to an S (scattering) parameter indicates the port number of a duplexer. That is, as illustrated in FIG. 20, in a clockwise direction, the antenna terminal 28*a* is the port 1, the input terminal 28*e* is the port 2, and the two output terminals 28*b* and 28*c* are the ports 3 and 4, respectively.

In the first preferred embodiment, arranging the ground pattern asymmetrically with respect to the center line X-X passing through the input pad 30*a* arranged to receive an unbalanced signal enables separation and concentration of a high-frequency current produced as a result of a parasitic component to be achieved at a desired location of the package substrate.

This action produces the advantageous effect of improving the degree of suppression in both lower and higher ranges than the pass band without a deterioration of the insertion loss, amplitude balance, and phase balance within the pass band in a balanced state, as illustrated in FIGS. 6A to 6D.

Improvements in separation and concentration of a high-frequency current produced as a result of a parasitic component can be observed in unbalanced output waveforms. As shown in FIGS. 7A to 7D, for the unbalanced output waveforms, the degrees of suppression in the vicinity of the pass band for both of the outputs 1 and 2 are improved. In addition, as shown in FIGS. 8A and 8B, the amplitude balance in the vicinity of the pass band is improved and the phase balance in almost all frequency bands is improved.

The first preferred embodiment merely improves the state of a current flowing through the ground pattern, such that it does not affect the insertion loss for each of the outputs 1 and 2, as is clear from FIGS. 7A to 7D.

As illustrated in FIGS. 9A to 9C, also in isolation characteristics, a similar action improves a band of the counterpart filter of the reception filter (that is, a pass band of the transmission filter). Improvements in the state of a current is clear from improvements in isolation in the band of the counterpart filter of the reception filter in the unbalanced output waveform, as in the case of the reception filter.

In the foregoing, the description is provided with reference to a duplexer as an example. However, even with a band pass filter having a similar configuration, a similar advantageous effect is obtainable. Any frequency bands can be used.

Second Preferred Embodiment

An elastic-wave filter device according to a second preferred embodiment of the present invention is described with reference to FIGS. 10A to 15C.

The elastic-wave filter device according to the second preferred embodiment has substantially the same configuration as that according to the first preferred embodiment, except for the configuration for the reception filter of the package substrate. In the following, the description is directed primarily to differences from the first preferred embodiment, and the same reference numerals are used as in the first preferred embodiment for the same components.

Figure 10A:
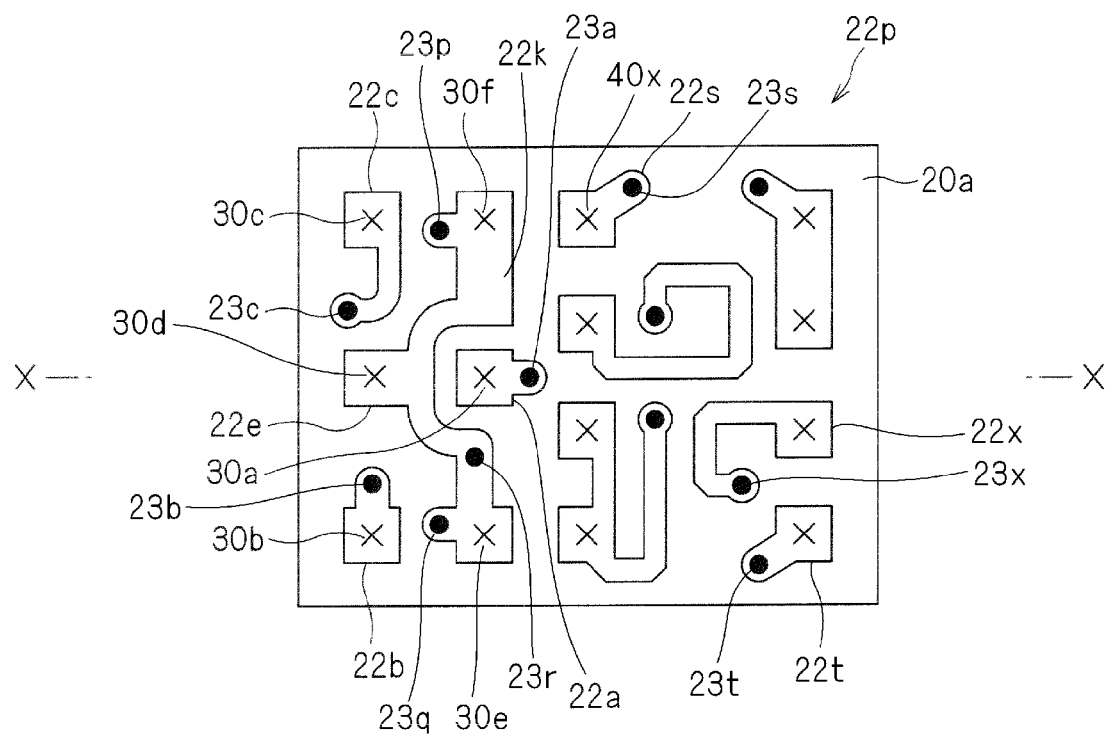
FIGS. 10A and 10B are plan views of a filter mounting surface of a package substrate according to a second preferred embodiment of the present invention and according to a second comparative example.

FIG. 10A is a plan view of the filter mounting surface 20*a* of the package substrate. In FIG. 10A, the cross symbols schematically indicate the locations of the pads of each of the reception filter and the transmission filter. The solid circle symbols schematically indicate the locations of the first via conductors provided between the filter mounting surface and the internal electrode surface.

As illustrated in FIG. 10A, which is seen from the direction perpendicular or substantially perpendicular to the filter mounting surface 20*a*, a filter mounting pattern 22*p* provided on the filter mounting surface 20*a* of the package substrate 20 preferably has the same or substantially the same shape as in the first preferred embodiment, except for a ground pattern element 22*e* connected to the pads 30*d*, 30*e*, and 30*f* of the reception filter 30.

In the ground pattern element 22*e* of the second preferred embodiment, a ground pad expansion portion 22*k* is preferably provided at only a first side with respect to the center line X-X, so the ground pattern element 22*e* is asymmetric with respect to the center line X-X.

The ground pattern element 22*e* is connected to the three first via conductors 23*p*, 23*q*, and 23*r*, as in the case of the first preferred embodiment. The first via conductors 23*p*, 23*q*, and 23*r* connected to the ground pattern element 22*e* are preferably asymmetric with respect to the center line X-X, as in the first preferred embodiment.

Figure 11A:
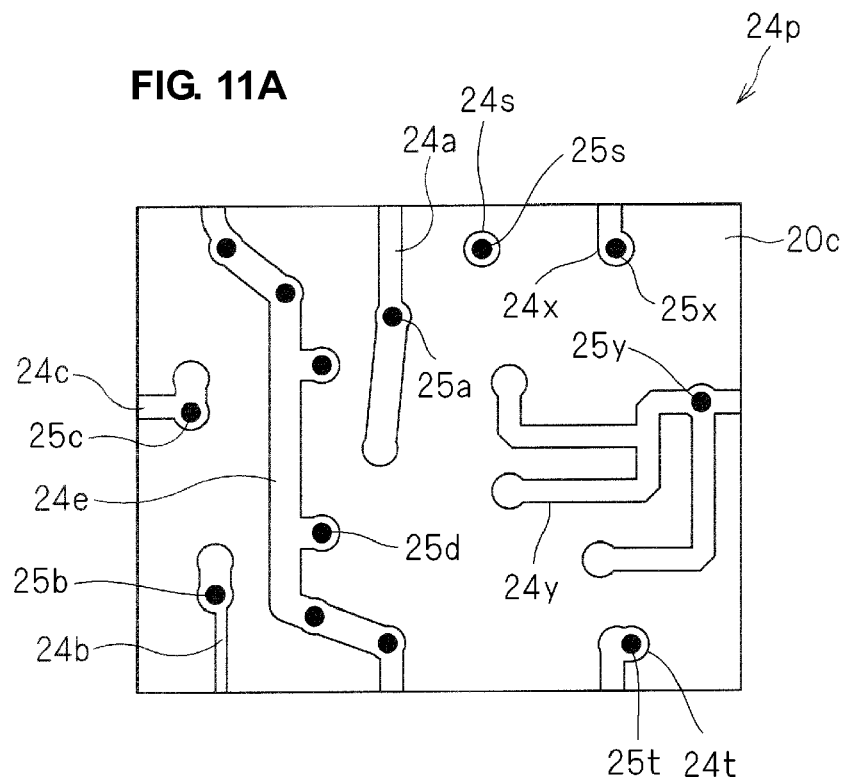
FIGS. 11A and 11B are a plan view of a second electrode surface and an illustration seen in plan view of a back-side terminal surface according to the second preferred embodiment of the present invention.

FIG. 11A is a plan view of the internal electrode surface 20*c* provided inside the package substrate 20. In FIG. 11A, the solid circle symbols schematically indicate the locations of the second via conductors 25 provided between the internal electrode surface 20*c* and the back-side terminal surface 20*b*. As illustrated in FIG. 11A, an internal electrode pattern 24*p* provided on the internal electrode surface 20*c* preferably differs from the internal electrode pattern 24 in the first preferred embodiment only in an internal ground pattern element 24e connected to the ground pattern element 22e on the filter mounting surface 20a with the first via conductors 23p, 23q, and 23r disposed therebetween. The internal ground pattern element 24e preferably has a shape that does not include portions 24p and 24q in the internal ground pattern element 24d of the first preferred embodiment illustrated in FIG. 5A.

Figure 11B:
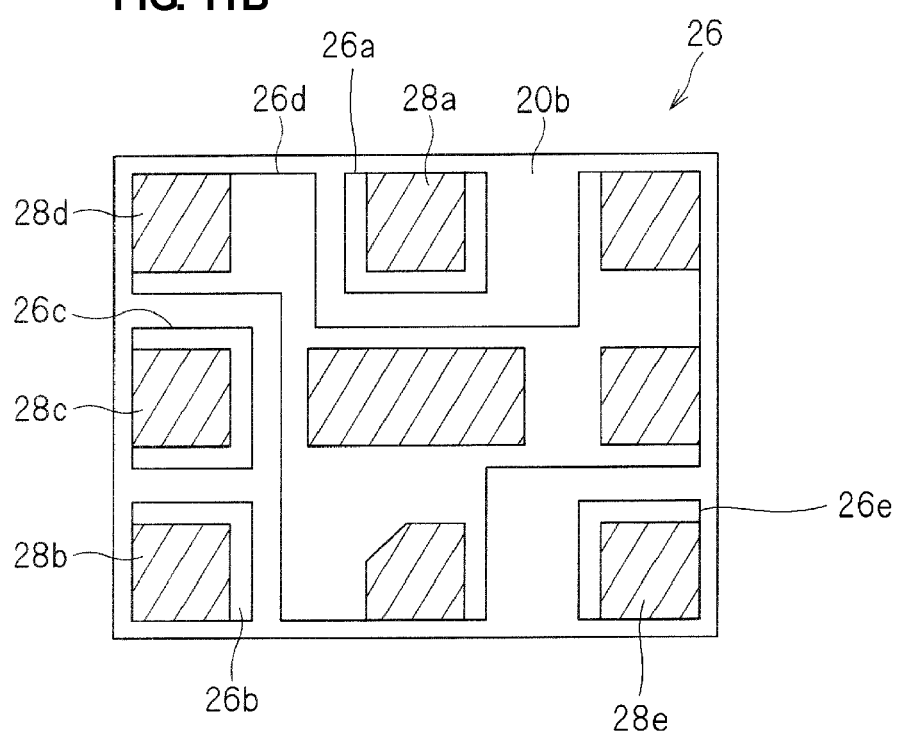

FIG. 11B is an illustration seen in plan view of the back-side terminal surface 20b of the package substrate 20. As illustrated in FIG. 11B, the back-side terminal pattern 26 and the back-side terminals 28a to 28d preferably having the same or substantially the same shape as in the first preferred embodiment illustrated in FIG. 5B are provided on the back-side terminal surface 20b.

Figure 10B:
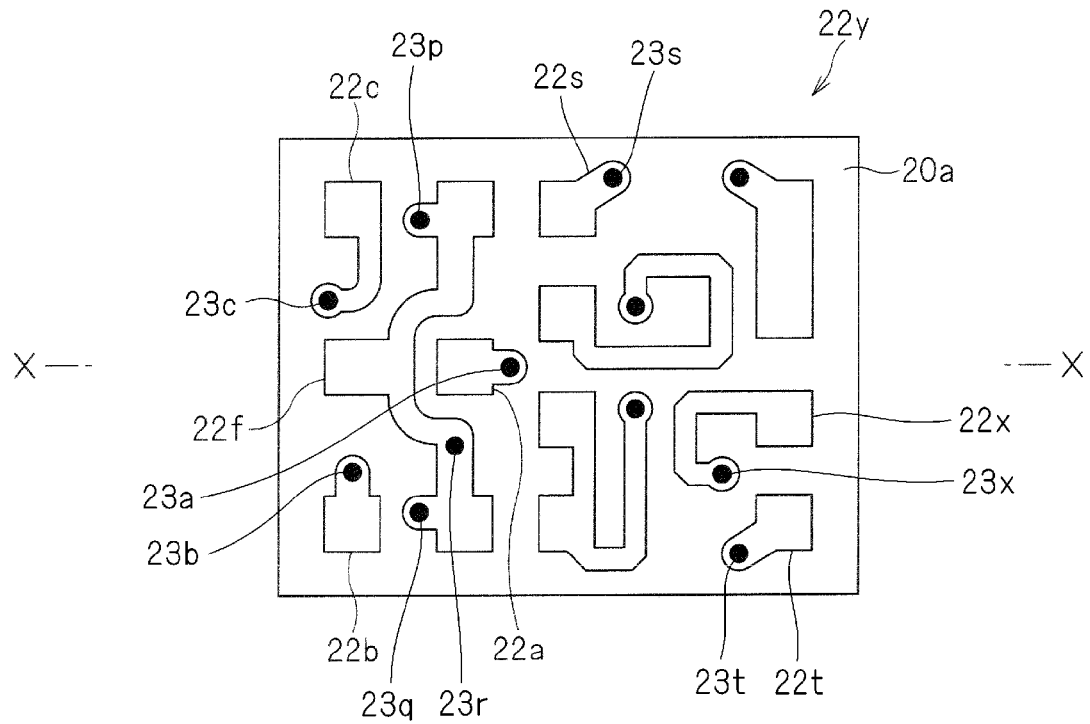

Next, a second comparative example is described with reference to FIG. 10B. FIG. 10B is a plan view of the filter mounting surface 20a of the package substrate 20, as in the case of FIG. 10A for the second preferred embodiment.

The second comparative example differs from the second preferred embodiment only in that a ground pattern element 22f of a filter mounting pattern 22y provided on the filter mounting surface 20a is symmetric with respect to the center line X-X and is the same as the second preferred embodiment in the remaining configuration. The ground pattern element 22f is connected to the first via conductors 23p, 23q, and 23r, as in the case of the second preferred embodiment.

Next, the results of characteristics measured for examples of the second preferred embodiment and second comparative example are shown in FIGS. 12A to 15C. The elastic-wave filter device of the examples is a duplexer designed for use in UMTS Band 8 and having the balanced-to-unbalanced transforming function. As the reception filter, a filter having its pass band of about 925 MHz to about 960 MHz and supporting a band of about 880 MHz to about 915 MHz of its counterpart filter was used. In FIGS. 12A to 15C, the solid lines indicate results of measurement for the example of the second preferred embodiment, and the broken lines indicate results of measurement for the example of the second comparative example.

Figure 12A:
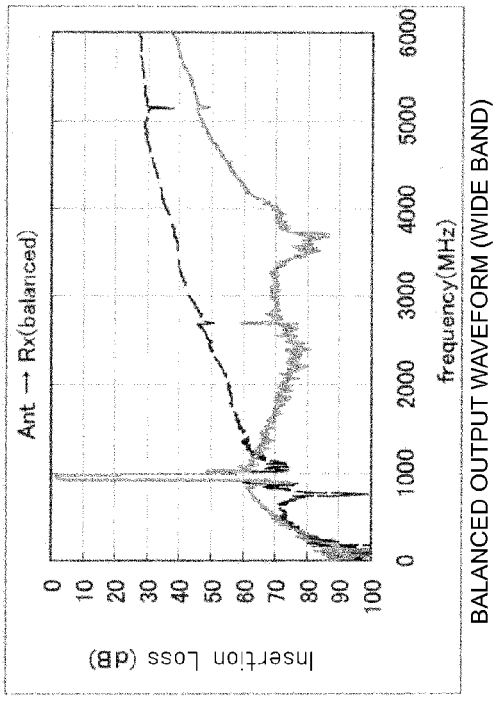
FIGS. 12A to 12D are graphs illustrating balanced output waveforms and balance according to the second preferred embodiment of the present invention and according to the second comparative example.
Figure 12B:
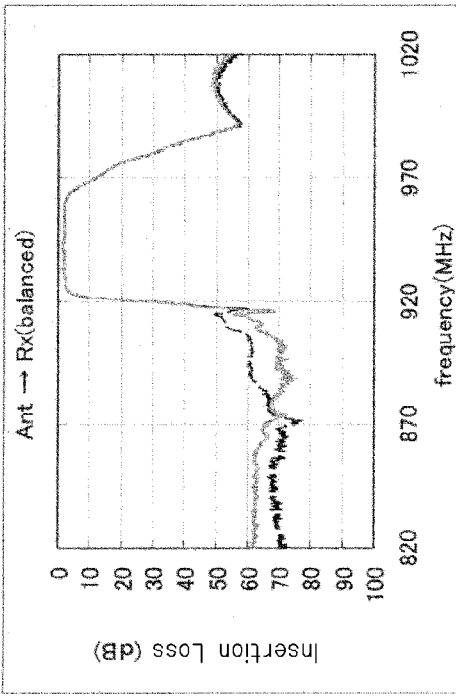
Figure 12C:
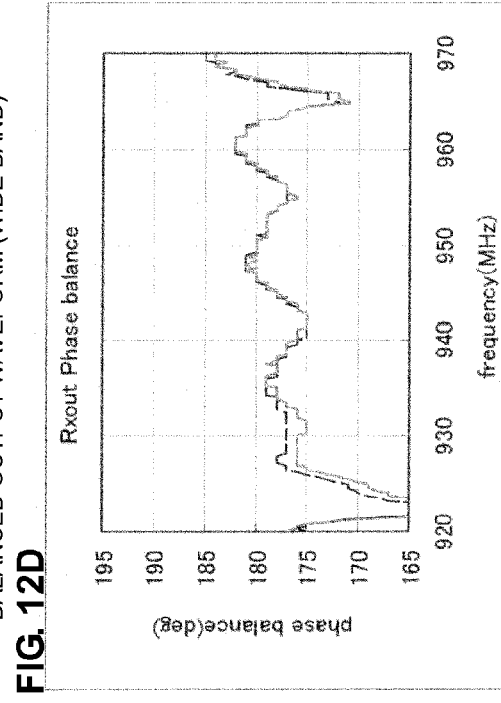
Figure 12D:
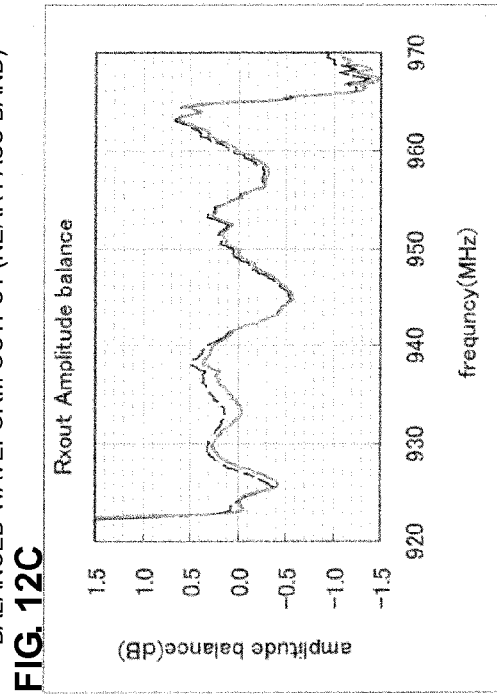
Figure 13A:
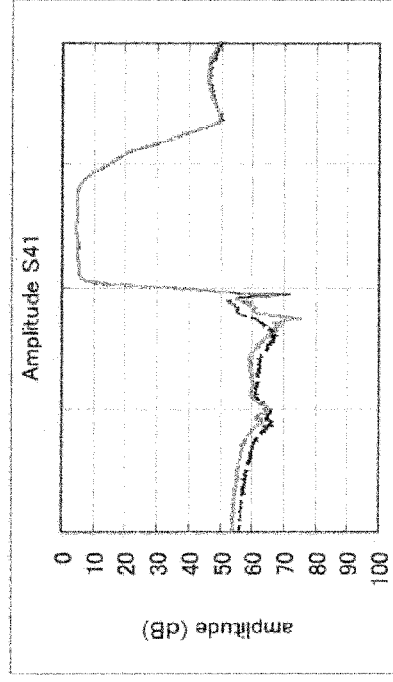
FIGS. 13A to 13D are graphs illustrating unbalanced output waveforms according to the second preferred embodiment of the present invention and according to the second comparative example.
Figure 13C:
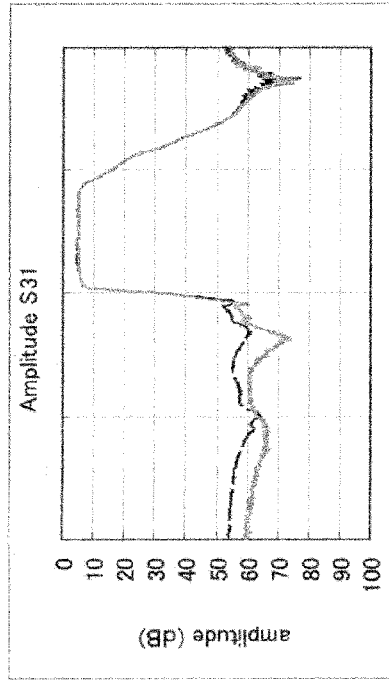
Figure 13B:
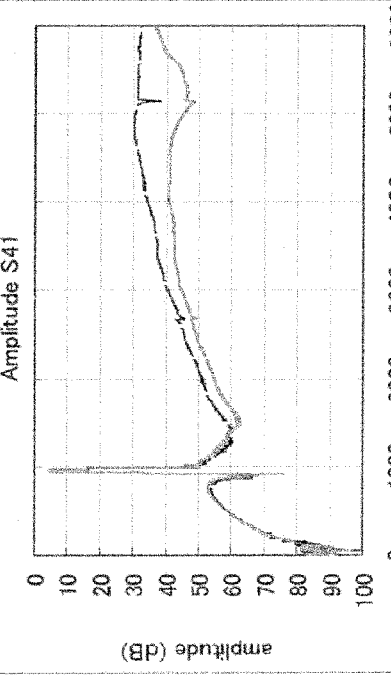
Figure 13D:
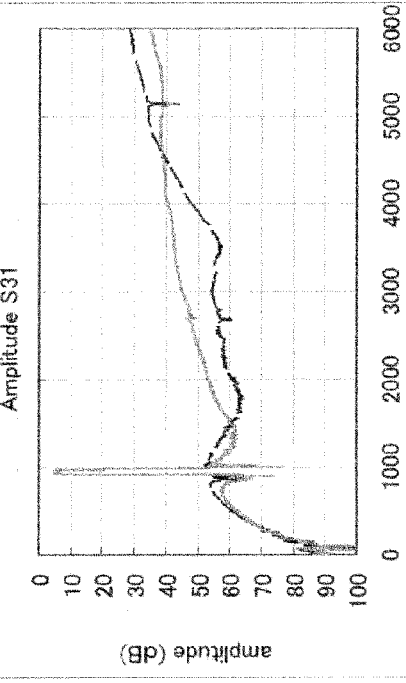

FIGS. 12A to 12D illustrate balanced output waveforms and balance. The phase balance illustrated in FIG. 12D is |∠S31-∠S41|. FIGS. 12A to 12D reveal that the degree of suppression in the vicinity of the pass band in a lower range and in harmonics in the second preferred embodiment is improved without a deterioration of the insertion loss, amplitude balance, and phase balance in comparison to the second comparative example.

FIGS. 13A to 13D illustrate unbalanced output waveforms. FIGS. 13A to 13D reveal that the degree of suppression in the vicinity of the pass band in an unbalanced state for the output 1 in the second preferred embodiment is improved as compared to the second comparative example. It is also revealed that the degree of suppression in harmonics in an unbalanced state for the output 2 is improved as compared to the second comparative example.

Figure 14A:
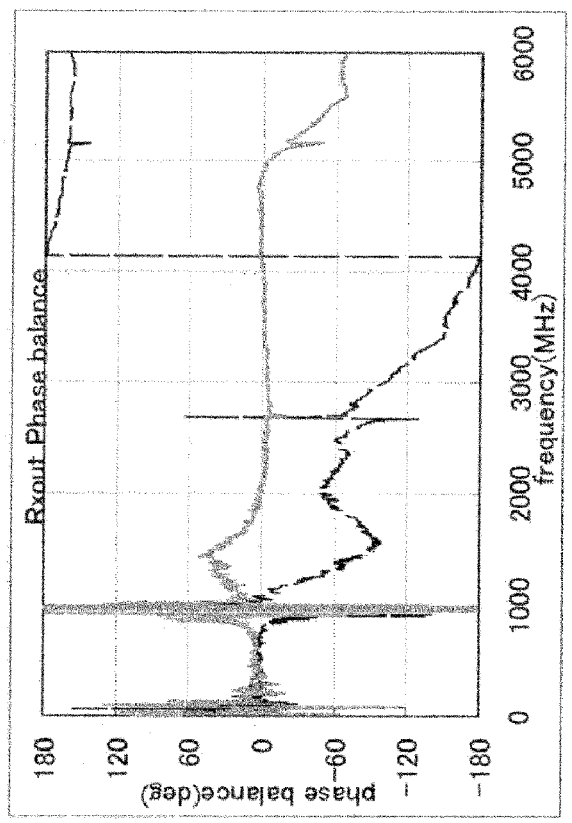
FIGS. 14A and 14B are graphs illustrating balance (in wide-band) according to the second preferred embodiment of the present invention and according to the second comparative example.
Figure 14B:
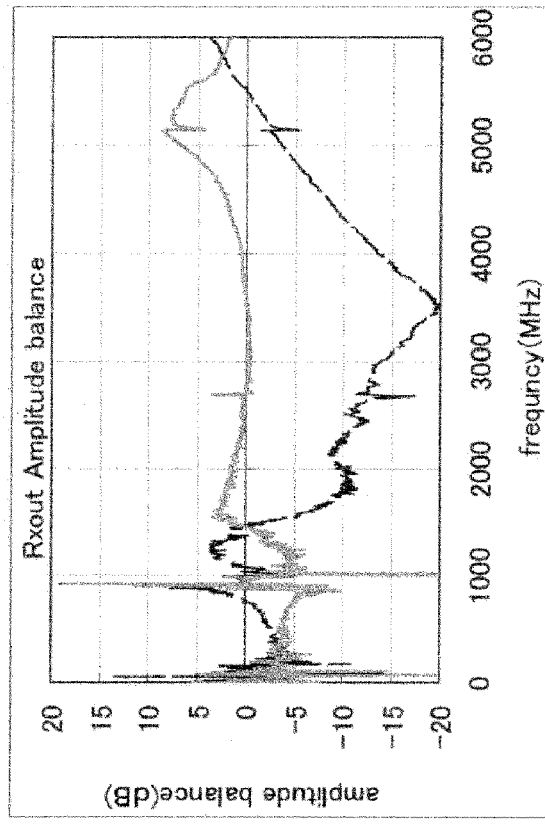

FIGS. 14A and 14B illustrate balance (in wide-band). The phase balance illustrated in FIG. 14B is |∠S31|-|∠S41|. FIGS. 14A and 14B reveal that the amplitude balance in harmonics is close to 0 dB and is improved as compared to the second comparative example and also that the phase balance in almost all frequency bands is close to 0 degree and is improved as compared to the second comparative example.

Figure 15A:
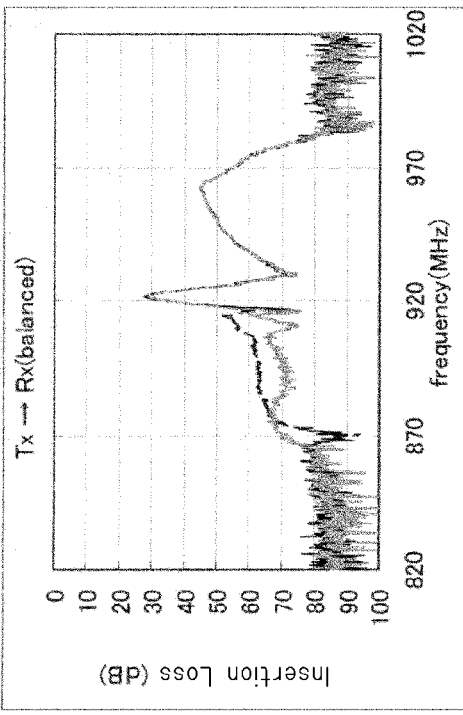
FIGS. 15A to 15C are graphs illustrating isolation characteristics according to the second preferred embodiment of the present invention and according to the second comparative example.
Figure 15B:
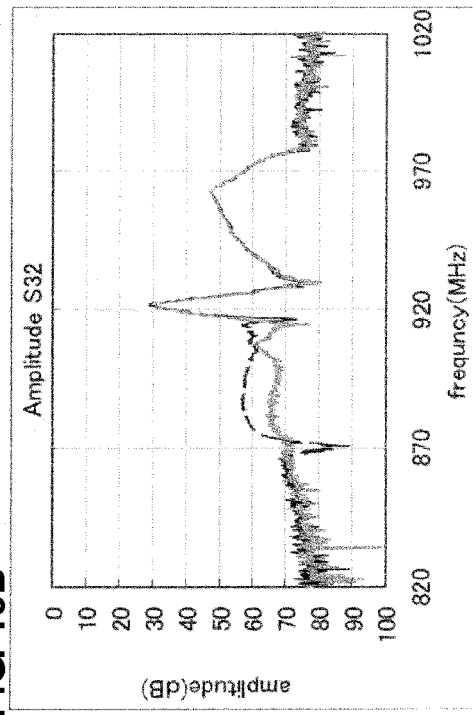
Figure 15C:
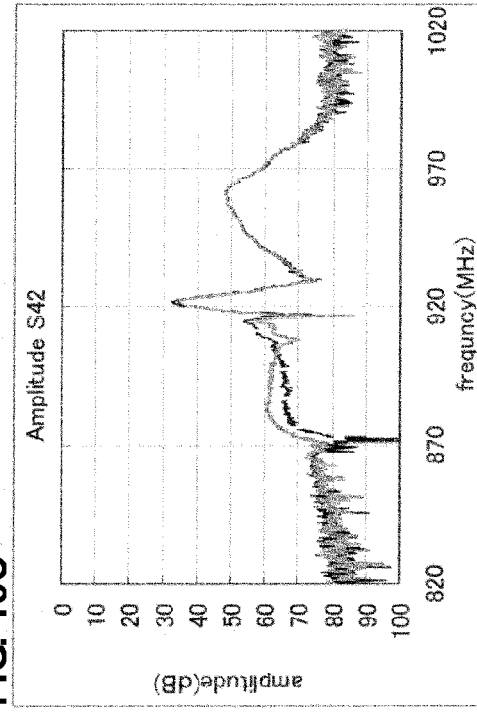

FIGS. 15A to 15C illustrate isolation characteristics. FIGS. 15A to 15C reveal that the isolation in the transmission band in the second preferred embodiment is improved as compared to the second comparative example. It is also revealed that the isolation in the transmission band for the output 1 is greatly improved in the second preferred embodiment.

The second preferred embodiment differs from the first preferred embodiment only in that the ground pattern element 22e on the filter mounting surface has a shape that is preferably asymmetric with respect to the center line X-X passing through the input pad 30a for receiving an unbalanced signal.

With the second preferred embodiment, the use of an asymmetric shape in the ground pattern element, which has a relatively high degree of flexibility in layout, enables the state of separation and concentration of a high-frequency current produced resulting from a parasitic component to be further improved. This improves the amplitude balance and phase balance in an out-of-band attenuation range, as illustrated in FIGS. 14A and 14B, and produces the advantageous effect of improving the degree of out-of-band suppression, as illustrated in FIGS. 12A to 12D.

In particular, with the second preferred embodiment, as illustrated in FIGS. 13A to 13D, the improvements in a lower range than the pass band in the unbalanced output waveform for the output 1 and in harmonics in the unbalanced output waveform for the output 2 are obtained.

As illustrated in FIGS. 15A to 15C, also in isolation characteristics, a band of the counterpart filter of the reception filter is also improved (that is, a pass band of the transmission filter). Improvements in the state of a current is clear from improvements in isolation in the band of the counterpart filter of the reception filter in the unbalanced output waveform illustrated in FIGS. 13A to 13D, as in the case of the reception filter.

In the foregoing, the description is provided with reference to a duplexer as an example. However, even with a band pass filter having a similar configuration, a similar advantageous effect is obtained. Any frequency bands can be used.

Third Preferred Embodiment

An elastic-wave filter device according to a third preferred embodiment of the present invention is described with reference to FIGS. 16A to 17.

The elastic-wave filter device according to the third preferred embodiment differs from that in each of the first and second preferred embodiments in that the reception filter is an unbalanced filter.

Figure 16A:
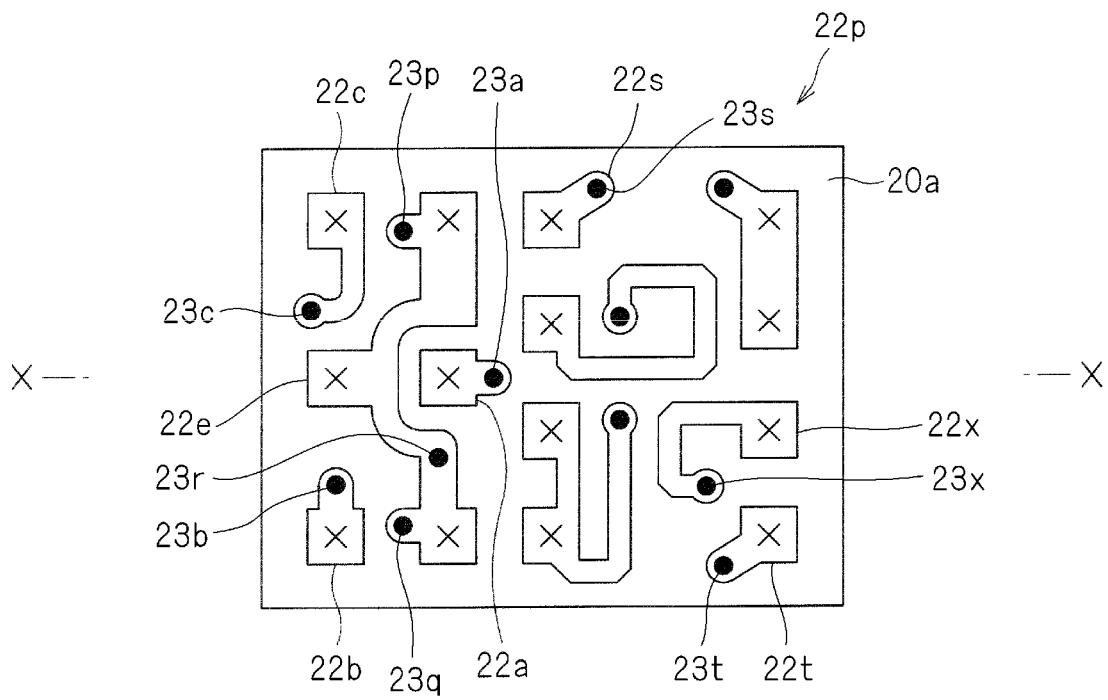
FIGS. 16A and 16B are a plan view of a filter mounting surface and a plan view of a second electrode surface according to a third preferred embodiment of the present invention.

FIG. 16A is a plan view of the filter mounting surface 20a of the package substrate. In FIG. 16A, the cross symbols schematically indicate the locations of the pads of each of the reception filter and the transmission filter. The solid circle symbols schematically indicate the locations of the first via conductors provided between the filter mounting surface 20a and the internal electrode surface 20c.

As illustrated in FIG. 16A, the filter mounting pattern 22p preferably having the same or substantially the same shape as in the second preferred embodiment is provided on the filter mounting surface 20a of the package substrate 20.

Figure 16B:
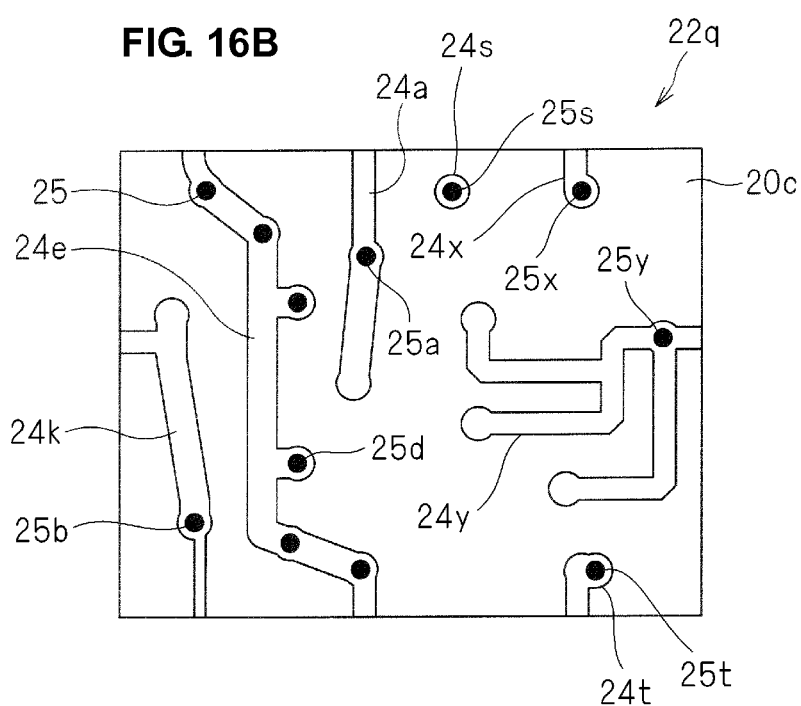

FIG. 16B is a plan view of the internal electrode surface 20c provided inside the package substrate. In FIG. 16B, the solid circle symbols schematically indicate the locations of the second via conductors provided between the internal electrode surface 20c and the back-side terminal surface 20b.

As illustrated in FIG. 16B, an internal electrode pattern 22q provided on the internal electrode surface 20c differs from the corresponding one in the second preferred embodiment only in an internal output pattern element 24k.

That is, for the second preferred embodiment, the two output pattern elements 22b and 22c on the filter mounting surface 20a are electrically connected to the different internal output pattern elements 24b and 24c provided on the internal electrode surface 20c, respectively, with the via conductors 23b and 23c disposed therebetween, respectively. In contrast, for the third preferred embodiment, the two output pattern elements 22*b* and 22*c* on the filter mounting surface 20*a* are preferably electrically connected to the single internal output pattern element 24*k* on the internal electrode surface 20*c* with the first via conductors 23*b* and 23*c* disposed therebetween. The third preferred embodiment does not include the second via conductor 25*c* in the second preferred embodiment.

Figure 17:
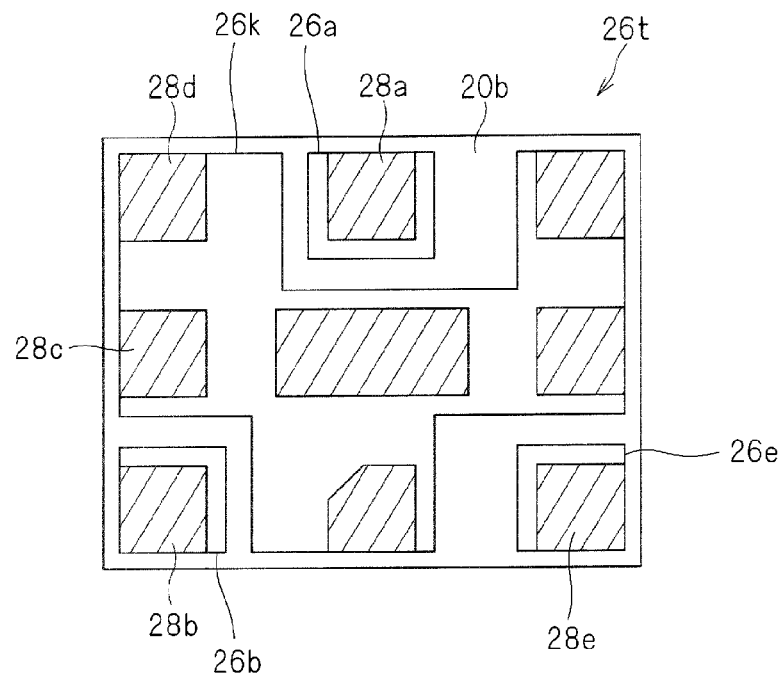
FIG. 17 is an illustration seen in plan view of a back-side terminal surface according to a third preferred embodiment of the present invention.

FIG. 17 is an illustration seen in plan view of the back-side terminal surface 20*b* of the package substrate. As illustrated in FIG. 17, a back-side terminal pattern 26*t* preferably having a different shape from that in each of the first and second preferred embodiments is provided on the back-side terminal surface 20*b*. That is, the back-side terminal pattern 26*t* preferably includes the first, second, and fifth pattern elements 26*a*, 26*b*, and 26*e* having the same or substantially the same shape as in the first and second preferred embodiments and a fifth pattern element 26*k* in which the third and fourth pattern elements 26*c* and 26*d* of the first and second preferred embodiments are integrally connected together. The back-side terminals 28*a* to 28*e* having the same or substantially the same shapes at the same or substantially the same locations as in the first and second preferred embodiments are preferably provided in the back-side terminal pattern 26*t*.

The second pattern element 26*b* is connected to the internal output pattern element 24*k* illustrated in FIG. 16B with the second via conductor 25*b* disposed therebetween. The back-side terminal 28*c* is an output terminal in the second preferred embodiment, whereas it is preferably a ground terminal in the third preferred embodiment because it is provided on the fifth pattern element 26*k*.

In the reception filter 30 of the elastic-wave filter device 10 according to the first and second preferred embodiments, the second IDT 37*b* of the longitudinally coupled resonator-type elastic-wave filter element 37 of the four longitudinally coupled resonator-type elastic-wave filter elements 33, 34, 37, and 38 is preferably inverted with respect to the second IDTs 33*b*, 34*b*, and 38*b* of the other longitudinally coupled resonator-type elastic-wave filter elements 33, 34, and 38. In the reception filter 30 of the elastic-wave filter device according to the third preferred embodiment, the second IDT 37*b* of the longitudinally coupled resonator-type elastic-wave filter element 37 is preferably the same or substantially the same as the second IDTs 33*b*, 34*b*, and 38*b* of the other longitudinally coupled resonator-type elastic-wave filter elements 33, 34, and 38, and the phase of a signal extracted from the first output pad 30*b* and the phase of a signal extracted from the second output pad 30*c* are preferably the same. Accordingly, one unbalanced output signal may be obtained from two signals.

Even when the reception filter is an unbalanced filter using unbalanced input and output, the elastic-wave filter device according to the third preferred embodiment provides the advantageous effect of improving out-of-band attenuation in a higher range than the pass band without a deterioration of the insertion loss within the pass band, similar to the first and second preferred embodiments.

Fourth Preferred Embodiment

Figure 18:
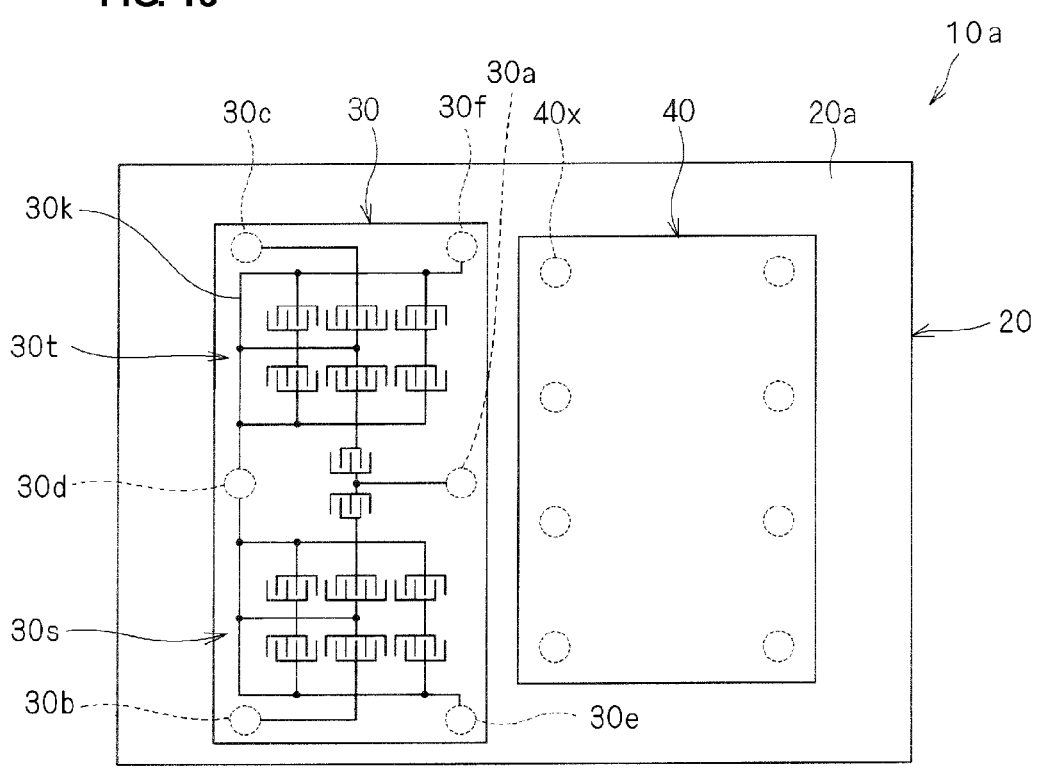
FIG. 18 is a plan view of an elastic-wave filter device according to a fourth preferred embodiment of the present invention.
Figure 19:
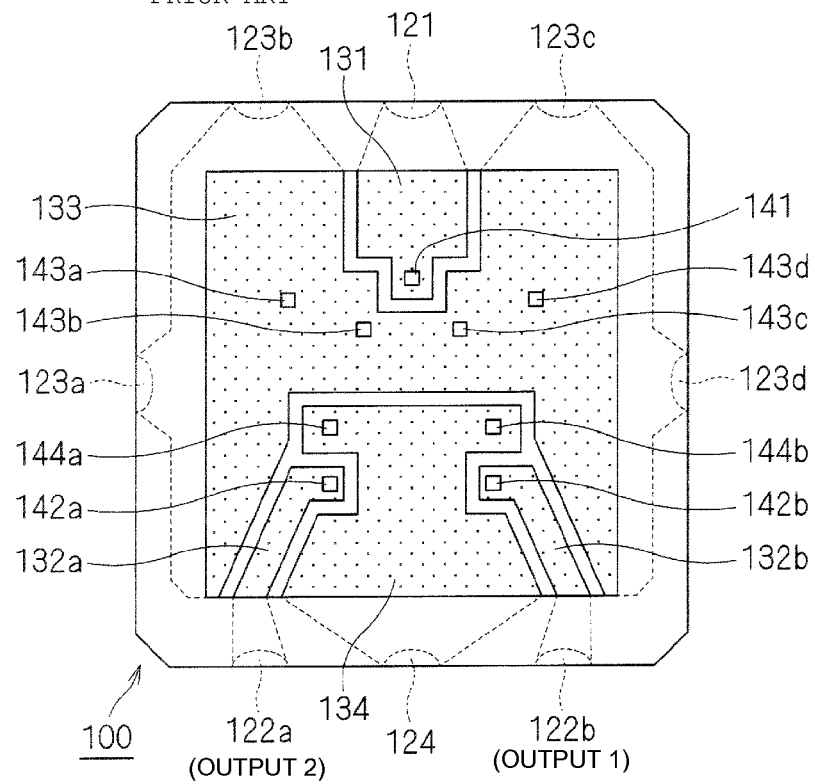
FIG. 19 is a plan view of a package substrate according to the related art.

An elastic-wave filter device 10*a* according to a fourth preferred embodiment of the present invention is described with reference to FIG. 18. FIG. 18 is a plan view of the elastic-wave filter device 10*a* and schematically illustrates an internal configuration of the reception filter 30.

The fourth preferred embodiment differs from the first preferred embodiment only in the element wiring inside the reception filter 30.

That is, in the first preferred embodiment, as illustrated in FIG. 2, element wiring 30*p* connected to the input ground pad 30*d* is separated from element wiring 30*q* and 30*r* connected to the output ground pads 30*e* and 30*f*, and the input ground pad 30*d* side is separated from the output ground pads 30*e* and 30*f* on the element wiring in the reception filter 30.

In contrast, in the fourth preferred embodiment, as illustrated in FIG. 18, the input ground pad 30*d* and the output ground pad 30*f* are connected together with element wiring 30*k* in the reception filter 30.

The elastic-wave filter device according to the fourth preferred embodiment provides the advantageous effect of improving out-of-band attenuation in a higher range than the pass band without a deterioration of the insertion loss and the degree of balance within the pass band by the use of adjustment at the package substrate side, as in the case of the first preferred embodiment. Accordingly, the degree of flexibility in element wiring in the reception filter 30*x* can be improved.

In preferred embodiments of the present invention, the arrangement of via conductors in a shared ground pattern is preferably asymmetric. This enables separation and concentration of a current to be achieved at a desired location of a surface-mountable package. This provides the advantageous effect of improving the degree of out-of-band suppression while the insertion loss in the pass band is maintained and not deteriorated.

In addition to asymmetric arrangement of via conductors, the ground pattern may also preferably have an asymmetric shape. This enables the state of separation and concentration of a current to be further improved. This provides the advantageous effect of improving balance in an out-of-band attenuation range in a filter having the balanced-to-unbalanced transforming function and of further improving the degree of out-of-band suppression.

In the above-described preferred embodiments of the present invention, the description is provided with respect to a longitudinally coupled resonator-type elastic-wave filter including two groups of cascaded longitudinally coupled resonator-type elastic-wave filter elements, for example. Alternatively, the longitudinally coupled resonator-type elastic-wave filter may preferably include a single longitudinally coupled resonator-type elastic-wave filter element. In the above-described preferred embodiments, the description is provided with respect to a surface-acoustic-wave (SAW) filter. Alternatively, the elastic-wave filter may preferably be a boundary-acoustic-wave filter that utilizes a boundary acoustic wave propagating along the boundary between a piezoelectric substrate and a solid layer. Additionally, the present invention is not limited to the above-described preferred embodiments and can be variously modified in practice.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic-wave filter device comprising:
   a longitudinally coupled resonator-type elastic-wave filter including an input pad, two output pads, and at least one ground pad; and
   a package substrate on which the longitudinally coupled resonator-type elastic-wave filter is mounted and including an insulation substrate body, a conductive filter mounting pattern provided on a first main surface of the substrate body, a conductive back-side terminal pattern provided on a second main surface of the substrate body, a conductive internal electrode pattern provided inside the substrate body, a plurality of first via conductors extending inside the substrate body and electrically connecting the filter mounting pattern and the internal electrode pattern, and a plurality of second via conductors extending inside the substrate body and electrically connecting the internal electrode pattern and the back-side terminal pattern; wherein the filter mounting pattern includes an input pattern element connected to the input pad of the longitudinally coupled resonator-type elastic-wave filter, two output pattern elements connected to the two output pads of the longitudinally coupled resonator-type elastic-wave filter, respectively, and a ground pattern element connected to the ground pad of the longitudinally coupled resonator-type elastic-wave filter;

the internal electrode pattern includes an internal ground pattern element connected to the ground pattern element of the filter mounting pattern through the plurality of first via conductors disposed therebetween;

the plurality of first via conductors electrically connecting the ground pattern element of the filter mounting pattern and the internal ground pattern element of the internal electrode pattern are arranged asymmetrically with respect to a center line extending parallel to a side edge of the package substrate, passing through a bump disposed on the input pattern element of the filter mounting pattern, and passing between the two output pattern elements of the filter mounting pattern;

for the plurality of first via conductors electrically connecting the ground pattern element of the filter mounting pattern and the internal ground pattern element of the internal electrode pattern, a number of the plurality of first via conductors arranged at a first side with respect to the center line is different from a number of the plurality of first via conductors arranged at a second side with respect to the center line;

of the plurality of first via conductors, a first via conductor connected to a first output pattern element of the two output pattern elements of the filter mounting pattern is arranged at a first side with respect to the center line and a first via conductor connected to a second output pattern element of the two output pattern elements of the filter mounting pattern is arranged at a second side with respect to the center line;

a distance between the first via conductor connected to the first output pattern element of the filter mounting pattern arranged at the first side and the center line is greater than a distance between the first via conductor connected to the second output pattern element of the filter mounting pattern arranged at the second side and the center line; and for the plurality of first via conductors electrically connecting the ground pattern element of the filter mounting pattern and the internal ground pattern element of the internal electrode pattern, a number of the plurality of first via conductors arranged at the first side with respect to the center line is greater than a number of the plurality of first via conductors arranged at the second side with respect to the center line.

2. The elastic-wave filter device according to claim 1, wherein the ground pattern element of the filter mounting pattern has a shape that is asymmetric with respect to the center line.

3. The elastic-wave filter device according to claim 1, wherein the longitudinally coupled resonator-type elastic-wave filter includes first and second elastic-wave filter elements;

each of the first and second elastic-wave filter elements includes an input terminal connected to the input pad directly or with another element disposed therebetween; and the first and second elastic-wave filter elements include output terminals connected to different output pads, respectively, directly or with another element disposed therebetween.

4. The elastic-wave filter device according to claim 3, wherein the first elastic-wave filter element includes first and second longitudinally coupled resonator-type elastic-wave filter units in cascade connection;

the second elastic-wave filter element includes third and fourth longitudinally coupled resonator-type elastic-wave filter units in cascade connection;

each of the first to fourth longitudinally coupled resonator-type elastic-wave filter units includes three IDTs arranged along a propagation direction of an elastic wave;

a first end of a centrally located IDT of the three IDTs of the first longitudinally coupled resonator-type elastic-wave filter unit and a first end of a centrally located IDT of the three IDTs of the third longitudinally coupled resonator-type elastic-wave filter unit are connected to the input pad directly or with another element disposed therebetween;

a first end of a centrally located IDT of the three IDTs of the second longitudinally coupled resonator-type elastic-wave filter unit is connected to a first output pad of the two output pads directly or with another element disposed therebetween;

a first end of a centrally located IDT of the three IDTs of the fourth longitudinally coupled resonator-type elastic-wave filter unit is connected to a second output pad of the two output pads directly or with another element disposed therebetween;

first ends of IDTs arranged at both sides of the three IDTs of the first longitudinally coupled resonator-type elastic-wave filter unit are connected to first ends of IDTs arranged at both sides of the three IDTs of the second longitudinally coupled resonator-type elastic-wave filter unit, respectively;

first ends of IDTs arranged at both sides of the three IDTs of the third longitudinally coupled resonator-type elastic-wave filter unit are connected to first ends of IDTs arranged at both sides of the three IDTs of the fourth longitudinally coupled resonator-type elastic-wave filter unit, respectively; and one of the first to fourth longitudinally coupled resonator-type elastic-wave filter units has a phase that differs by 180 degrees from a phase of the other three.

5. A duplexer comprising:

the elastic-wave filter device according to claim 1; and a transmission filter mounted on the package substrate of the elastic-wave filter device and including a ladder circuit; wherein the longitudinally coupled resonator-type elastic-wave filter of the elastic-wave filter device is a reception band pass filter;

the substrate body of the package substrate of the elastic-wave filter device includes the first and second main surfaces and four side surfaces extending between the first and second main surfaces, the first and second main surfaces being substantially rectangular and spaced away from each other and extending parallel or substantially parallel to each other;

the back-side terminal pattern provided on the second main surface of the substrate body includes two output terminals arranged along a side surface of the four side surfaces and an antenna terminal arranged along another side surface being adjacent to the side surface; and
the antenna terminal is connected to the input pad of the longitudinally coupled resonator-type elastic-wave filter and to an end of the transmission filter.

6. An elastic-wave filter device comprising:
a longitudinally coupled resonator-type elastic-wave filter including an input pad, two output pads, and at least one ground pad; and
a package substrate on which the longitudinally coupled resonator-type elastic-wave filter is mounted and including an insulation substrate body, a conductive filter mounting pattern provided on a first main surface of the substrate body, a conductive back-side terminal pattern provided on a second main surface of the substrate body, a conductive internal electrode pattern provided inside the substrate body, a plurality of first via conductors extending inside the substrate body and electrically connecting the filter mounting pattern and the internal electrode pattern, and a plurality of second via conductors extending inside the substrate body and electrically connecting the internal electrode pattern and the back-side terminal pattern; wherein
the filter mounting pattern includes an input pattern element connected to the input pad of the longitudinally coupled resonator-type elastic-wave filter, two output pattern elements connected to the two output pads of the longitudinally coupled resonator-type elastic-wave filter, respectively, and a ground pattern element connected to the ground pad of the longitudinally coupled resonator-type elastic-wave filter;
the internal electrode pattern includes an internal ground pattern element connected to the ground pattern element of the filter mounting pattern through the plurality of first via conductors disposed therebetween;
the plurality of first via conductors electrically connecting the ground pattern element of the filter mounting pattern and the internal ground pattern element of the internal electrode pattern are arranged asymmetrically with respect to a center line extending in parallel to a side edge of the package substrate, passing through a bump disposed on the input pattern element of the filter mounting pattern, and passing between the two output pattern elements of the filter mounting pattern;
for the plurality of first via conductors electrically connecting the ground pattern element of the filter mounting pattern and the internal ground pattern element of the internal electrode pattern, a number of the plurality of first via conductors arranged at a first side with respect to the center line is different from a number of the plurality of first via conductors arranged at a second side with respect to the center line;
the substrate body of the package substrate includes the first and second main surfaces and four side surfaces extending between the first and second main surfaces, the first and second main surfaces being substantially rectangular and spaced away from each other and extending parallel or substantially in parallel to each other;
the back-side terminal pattern provided on the second main surface of the substrate body includes two output terminals arranged along one of the four side surfaces;
when the substrate body is seen in plan view from a direction perpendicular or substantially perpendicular to the first main surface thereof, only a first output terminal of the two output terminals is arranged on the center line; and
for the plurality of first via conductors connecting the ground pattern element of the filter mounting pattern and the internal ground pattern element of the internal electrode pattern, a number of the plurality of first via conductors arranged at a first side at which a second output terminal of the two output terminals with respect to the center line is arranged is greater than a number of the plurality of first via conductors arranged at a second side with respect to the center line.

7. The elastic-wave filter device according to claim 6, wherein the ground pattern element of the filter mounting pattern has a shape that is asymmetric with respect to the center line.

8. The elastic-wave filter device according to claim 6, wherein
the longitudinally coupled resonator-type elastic-wave filter includes first and second elastic-wave filter elements;
each of the first and second elastic-wave filter elements includes an input terminal connected to the input pad directly or with another element disposed therebetween; and
the first and second elastic-wave filter elements include output terminals connected to different output pads, respectively, directly or with another element disposed therebetween.

9. The elastic-wave filter device according to claim 8, wherein
the first elastic-wave filter element includes first and second longitudinally coupled resonator-type elastic-wave filter units in cascade connection;
the second elastic-wave filter element includes third and fourth longitudinally coupled resonator-type elastic-wave filter units in cascade connection;
each of the first to fourth longitudinally coupled resonator-type elastic-wave filter units includes three IDTs arranged along a propagation direction of an elastic wave;
a first end of a centrally located IDT of the three IDTs of the first longitudinally coupled resonator-type elastic-wave filter unit and a first end of a centrally located IDT of the three IDTs of the third longitudinally coupled resonator-type elastic-wave filter unit are connected to the input pad directly or with another element disposed therebetween;
a first end of a centrally located IDT of the three IDTs of the second longitudinally coupled resonator-type elastic-wave filter unit is connected to a first output pad of the two output pads directly or with another element disposed therebetween;
a first end of a centrally located IDT of the three IDTs of the fourth longitudinally coupled resonator-type elastic-wave filter unit is connected to a second output pad of the two output pads directly or with another element disposed therebetween;
first ends of IDTs arranged at both sides of the three IDTs of the first longitudinally coupled resonator-type elastic-wave filter unit are connected to first ends of IDTs arranged at both sides of the three IDTs of the second longitudinally coupled resonator-type elastic-wave filter unit, respectively;
first ends of IDTs arranged at both sides of the three IDTs of the third longitudinally coupled resonator-type elastic-wave filter unit are connected to first ends of IDTs arranged at both sides of the three IDTs of the fourth longitudinally coupled resonator-type elastic-wave filter unit, respectively; and one of the first to fourth longitudinally coupled resonator-type elastic-wave filter units has a phase that differs by 180 degrees from a phase of the other three.

10. A duplexer comprising:

elastic-wave filter device according to claim 6; and a transmission filter mounted on the package substrate of the elastic-wave filter device and including a ladder circuit; wherein the longitudinally coupled resonator-type elastic-wave filter of the elastic-wave filter device is a reception band pass filter;

the substrate body of the package substrate of the elastic-wave filter device includes the first and second main surfaces and four side surfaces extending between the first and second main surfaces, the first and second main surfaces being substantially rectangular and spaced away from each other and extending parallel or substantially parallel to each other;

the back-side terminal pattern provided on the second main surface of the substrate body includes two output terminals arranged along a side surface of the four side surfaces and an antenna terminal arranged along another side surface being adjacent to the side surface; and the antenna terminal is connected to the input pad of the longitudinally coupled resonator-type elastic-wave filter and to an end of the transmission filter.

* * * * *